United States Patent
Weis et al.

(10) Patent No.: US 9,941,375 B2
(45) Date of Patent: Apr. 10, 2018

(54) METHOD FOR MANUFACTURING A SEMICONDUCTOR DEVICE HAVING SILICIDE LAYERS

(71) Applicant: Infineon Technologies Dresden GmbH, Dresden (DE)

(72) Inventors: Rolf Weis, Dresden (DE); Martin Bartels, Dresden (DE); Marko Lemke, Dresden (DE); Stefan Tegen, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/417,436

(22) Filed: Jan. 27, 2017

(65) Prior Publication Data

US 2017/0222010 A1    Aug. 3, 2017

(30) Foreign Application Priority Data

Jan. 28, 2016   (DE) .................. 10 2016 101 545

(51) Int. Cl.
| | |
|---|---|
| *H01L 29/45* | (2006.01) |
| *H01L 29/78* | (2006.01) |
| *H01L 29/10* | (2006.01) |
| *H01L 29/06* | (2006.01) |
| *H01L 21/285* | (2006.01) |
| *H01L 29/66* | (2006.01) |

(52) U.S. Cl.
CPC ........ *H01L 29/45* (2013.01); *H01L 21/28518* (2013.01); *H01L 29/0696* (2013.01); *H01L 29/1095* (2013.01); *H01L 29/66696* (2013.01); *H01L 29/7825* (2013.01)

(58) Field of Classification Search
CPC ..... H01L 21/32053; H01L 2924/10827; H01L 21/32051; H01L 29/4975; H01L 29/66507; H01L 29/4933; H01L 29/4941; H01L 21/2257; H01L 21/28097; H01L 21/28052; H01L 29/78618
See application file for complete search history.

(56) References Cited

U.S. PATENT DOCUMENTS

| | | | |
|---|---|---|---|
| 6,309,948 B1 | 10/2001 | Lin et al. | |
| 6,849,495 B2 | 2/2005 | Wensley et al. | |
| 8,039,339 B2 | 10/2011 | Grant et al. | |
| 2007/0170498 A1 | 7/2007 | Hu et al. | |

(Continued)

FOREIGN PATENT DOCUMENTS

DE        102004007895 A1    9/2004

*Primary Examiner* — Yasser A Abdelaziez
(74) *Attorney, Agent, or Firm* — Murphy, Bilak & Homiller, PLLC

(57) ABSTRACT

A method for manufacturing a semiconductor device includes providing a semiconductor substrate having a first side. A trench having a bottom is formed. The trench separates a first mesa region from a second mesa region formed in the semiconductor substrate. The trench is filled with an insulating material, and the second mesa region is removed relative to the insulating material filled in the trench to form a recess in the semiconductor substrate. In a common process, a first silicide layer is formed on and in contact with a top region of the first mesa region at the first side of the semiconductor substrate and a second silicide layer is formed on and in contact with the bottom of the recess.

7 Claims, 16 Drawing Sheets

(56) References Cited

U.S. PATENT DOCUMENTS

2012/0119277 A1* 5/2012 Chuang ............ H01L 27/10876
257/300
2012/0280307 A1* 11/2012 Su ........................ H01L 29/872
257/328

* cited by examiner

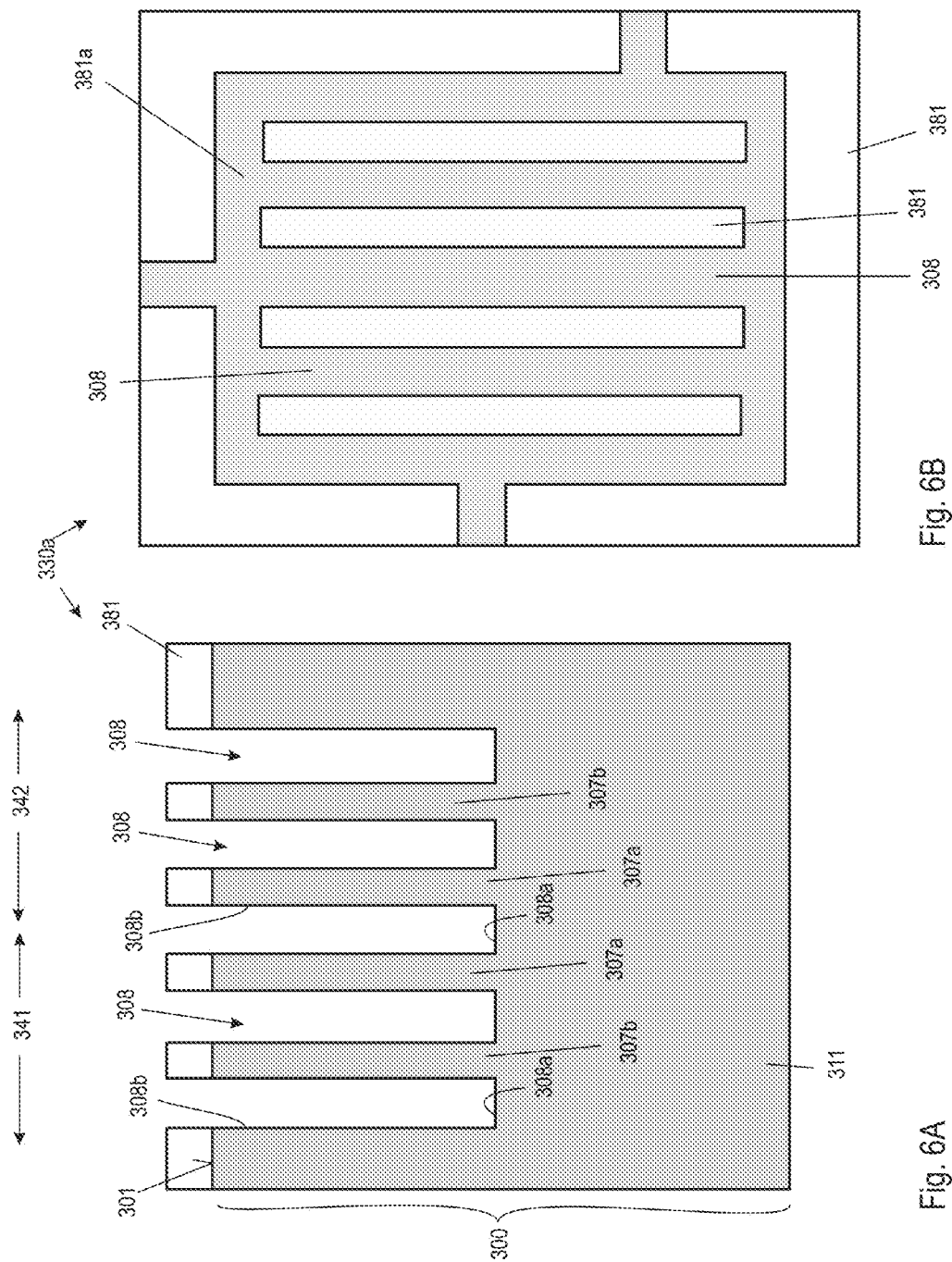

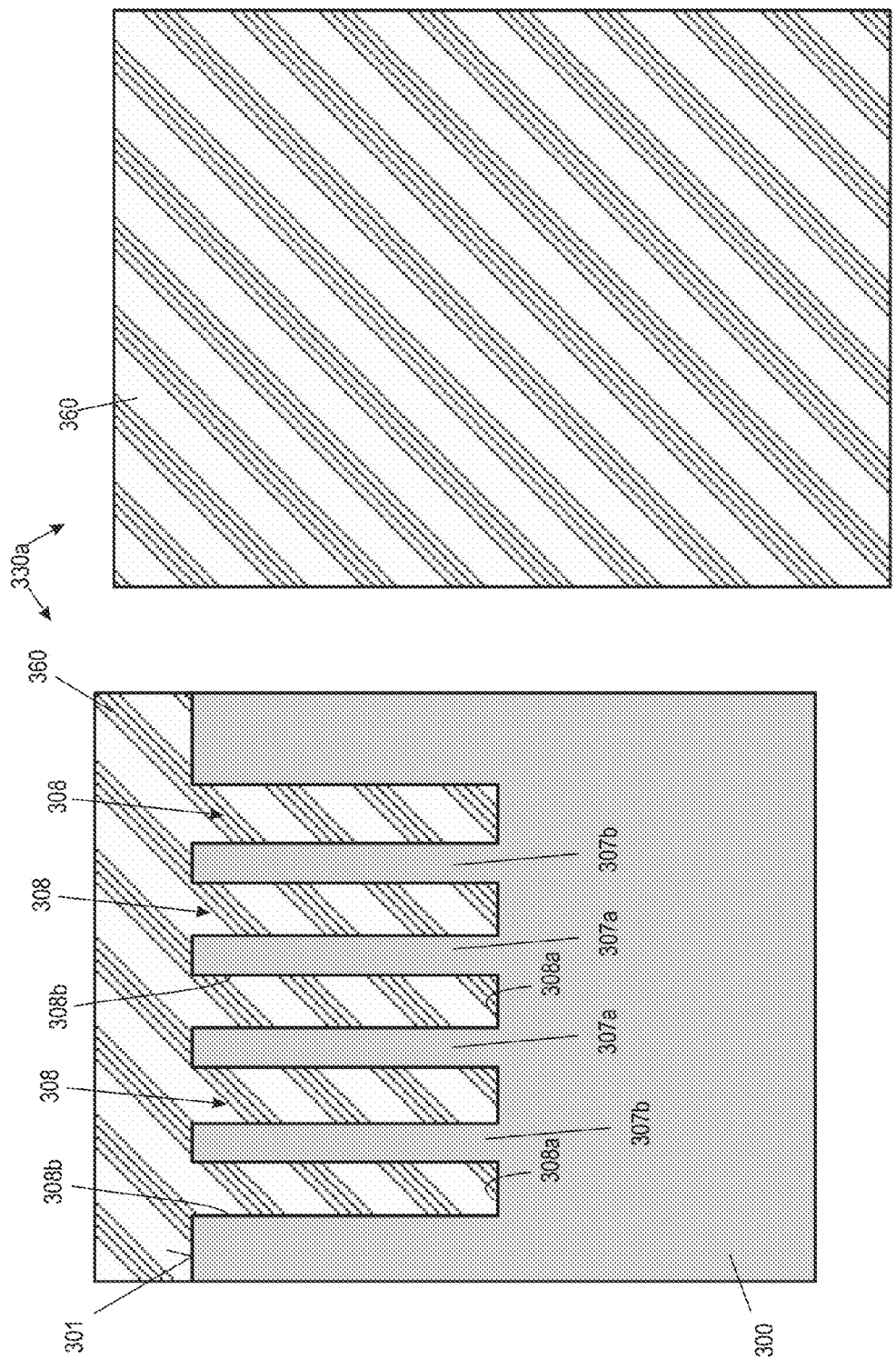

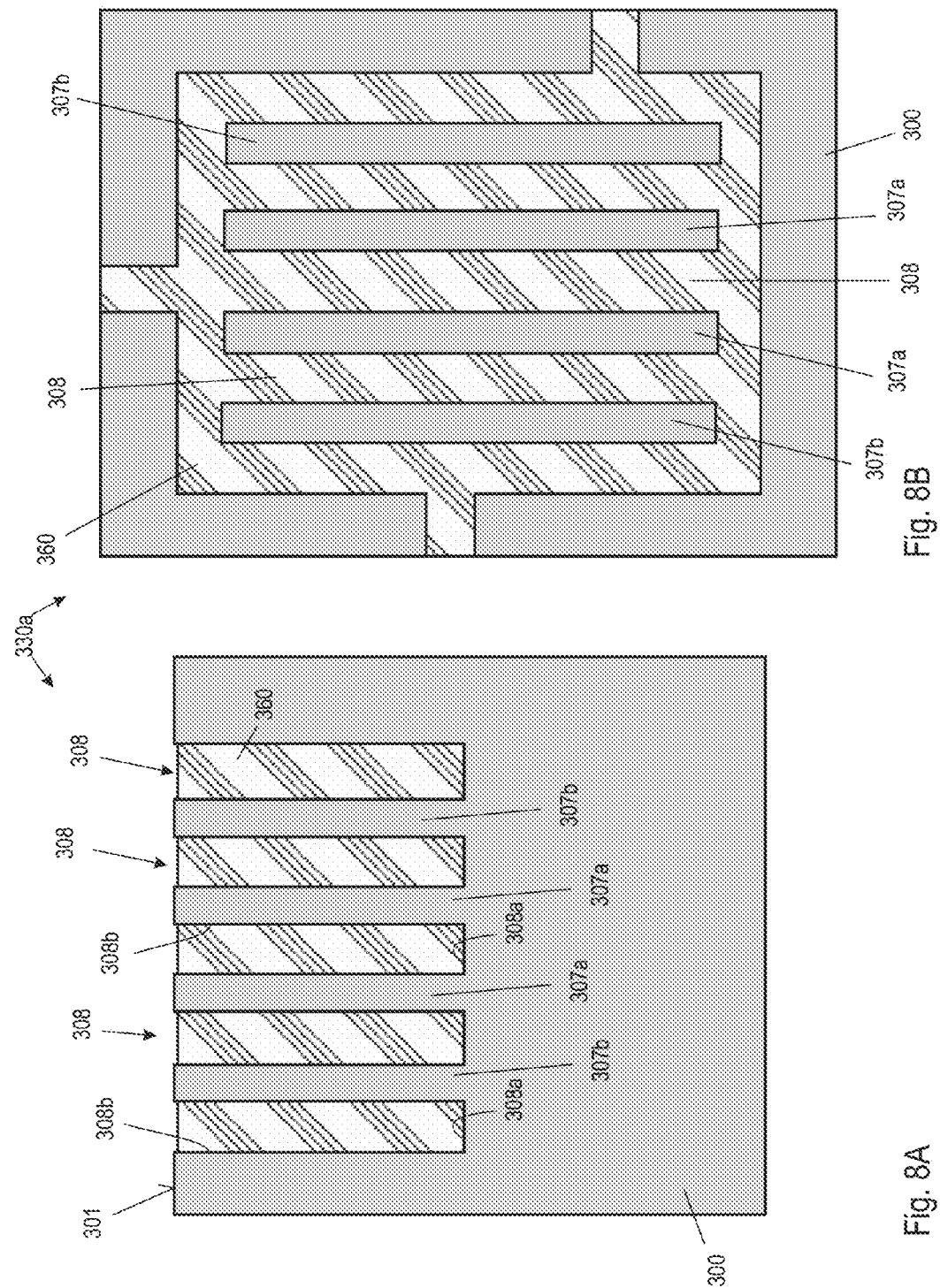

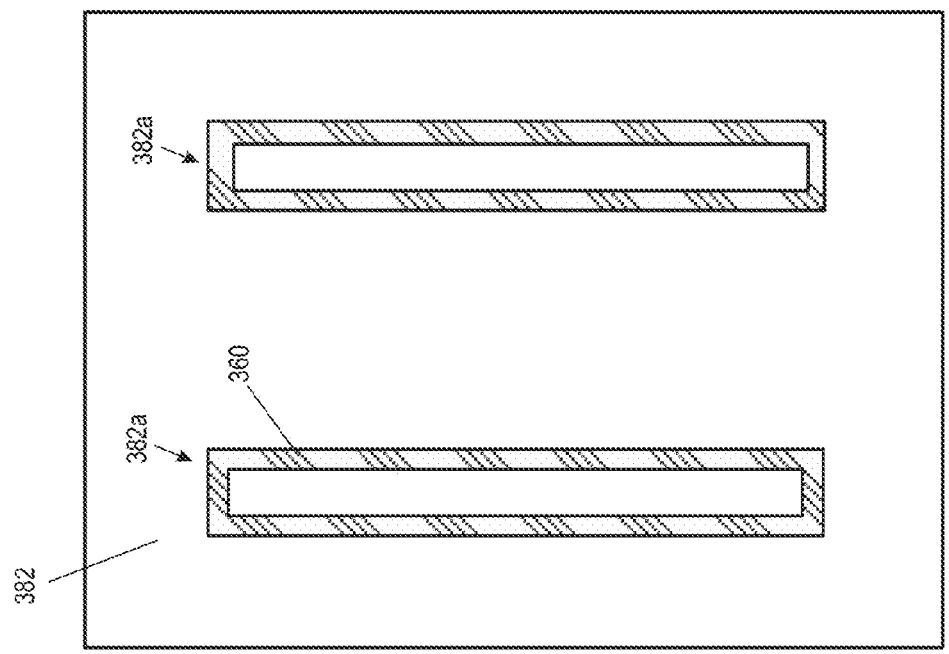
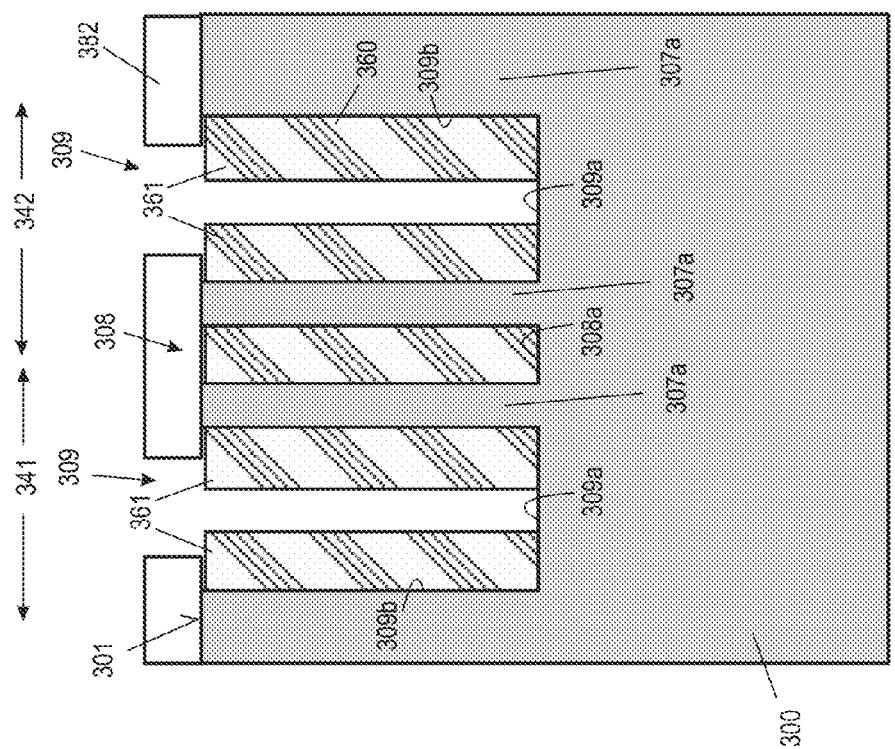

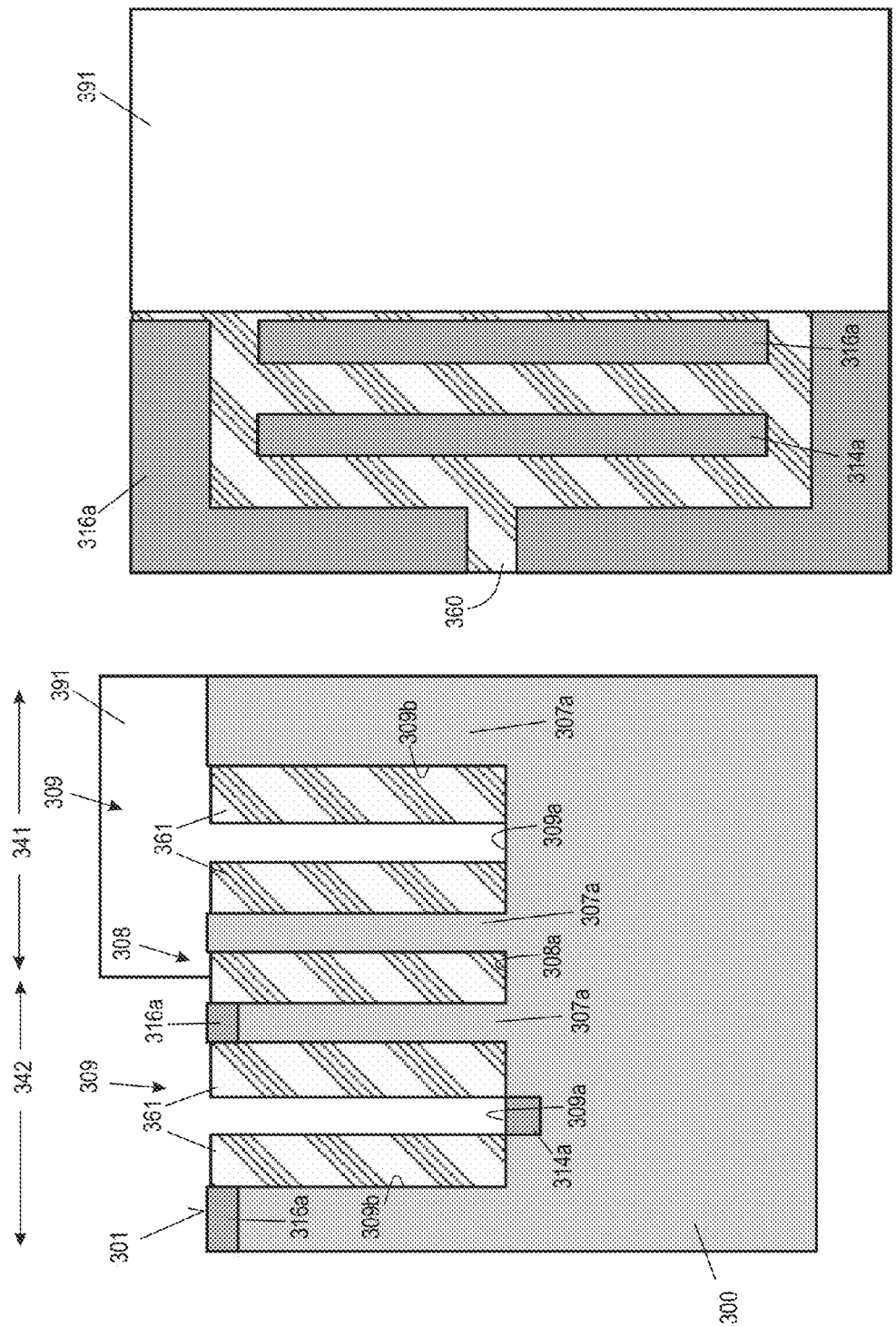

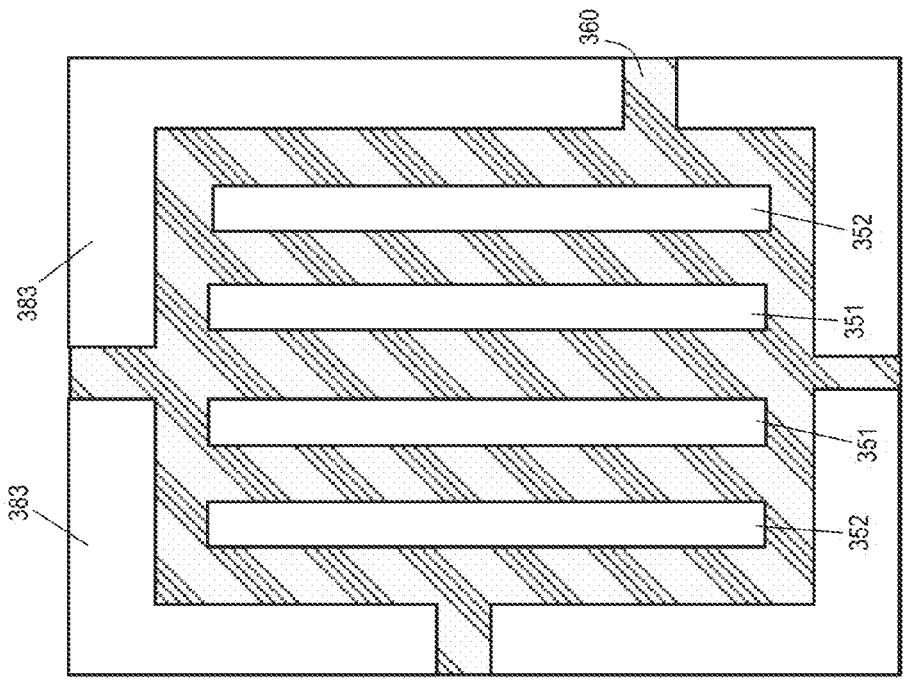
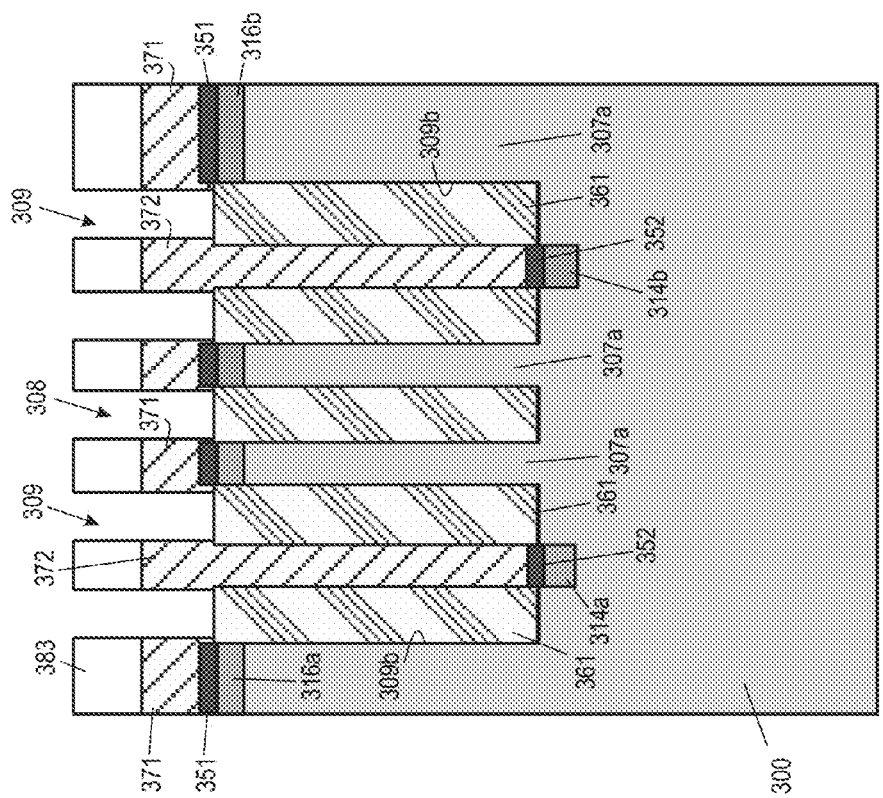
Fig. 14A
Fig. 14B

METHOD FOR MANUFACTURING A SEMICONDUCTOR DEVICE HAVING SILICIDE LAYERS

TECHNICAL FIELD

Embodiments described herein relate to methods for manufacturing semiconductor devices having silicide layers, and to semiconductor devices such as power FETs.

BACKGROUND

Low ohmic electrical connections between conductors and doping regions formed in the semiconductor substrate of semiconductor devices are needed to reduce losses and switching capacities. One option to reduce the transition resistance at a junction between, for example, a metal layer and a semiconductor material, is to provide contact doping regions with high doping concentration. Another option is to provide a silicide layer between the metal layer and the semiconductor substrate. However, integrating silicide layers into existing manufacturing processes typically require additional steps and thus increase the manufacturing costs.

There is therefore a desire to provide improved manufacturing processes.

SUMMARY

According to an embodiment, a method for manufacturing a semiconductor device, includes: providing a semiconductor substrate having a first side; forming a trench having a bottom, the trench extending from the first side of the semiconductor substrate into the semiconductor substrate and separating a first mesa region formed in the semiconductor substrate from a second mesa region formed in the semiconductor substrate; filling the trench with an insulating material: removing the second mesa region relative to the insulating material filled in the trench to form a recess in the semiconductor substrate, the recess having at least one side wall covered with the insulating material and a bottom; and forming, in a common process, a first silicide layer on and in contact with a top region of the first mesa region at the first side of the semiconductor substrate and a second silicide layer on and in contact with the bottom of the recess.

According to an embodiment, a method for manufacturing a semiconductor device, includes: providing a semiconductor substrate having a first side; forming a plurality of trenches extending from the first side of the semiconductor substrate into the semiconductor substrate and a plurality of semiconductor mesa regions extending to the first side, wherein between two adjacent trenches a respective semiconductor mesa region is arranged; removing selected semiconductor mesa regions between given adjacent trenches to form merged trenches with exposed bottom portions; forming respective first doping regions in remaining semiconductor mesa regions at the first side of the semiconductor substrate; forming second doping regions in the exposed bottom portions; forming respective first silicide layers on and in contact with the first doping regions and second silicide layers on and in contact with the second doping regions: and forming respective first metal layers on and in contact with the first silicide layers and second metal layers on and in contact with the second silicide layers.

According to an embodiment, a method for manufacturing a semiconductor device, includes: providing a semiconductor substrate having a first side; forming a plurality of first and second trenches extending from the first side of the semiconductor substrate into the semiconductor substrate and a plurality of first and second semiconductor mesa regions extending to the first side, wherein between two adjacent first trenches a respective first semiconductor mesa region is arranged, and wherein between two adjacent second trenches a respective second semiconductor mesa region is arranged; removing at least one first semiconductor mesa region between two adjacent first trenches so that the two adjacent first trenches merge and form a first common trench and removing at least one second semiconductor mesa region between two adjacent second trenches so that the two adjacent second trenches merge and form a second common trench; forming first doping regions of a first conductivity type in remaining first mesa regions and second doping regions of the first conductivity type in a bottom portion of the first common trench; forming first doping regions of a second conductivity type in remaining second mesa regions and second doping regions of the second conductivity type in a bottom portion of the second common trench; forming first silicide layers on and in contact with the first doping regions and second silicide layers on and in contact with the second doping regions; and forming first metal layers on and in contact with the first silicide layers and second metal layers on and in contact with the second silicide layers.

According to an embodiment, a semiconductor device includes: a semiconductor substrate having a first side; a trench structure having a bottom and a sidewall, the bottom having at least a first bottom portion and a second bottom portion laterally adjacent to the first bottom portion, wherein each of the first and second bottom portions have a concave shape with a ridge formed between the first and second bottom portion; an insulating material covering the sidewall and the first bottom portion of the recess while leaving the second bottom portion of the recess uncovered; a mesa region extending to the first side of the semiconductor substrate and forming the sidewall of the trench structure; a first silicide layer on a top region of the mesa region; a second silicide layer on the second bottom portion of the trench structure; a first metal layer on and in contact with the first silicide layer; and a second metal layer on and in contact with the second silicide layer.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference signs designate corresponding parts. In the drawings:

FIG. 6A illustrates a cross-sectional view and FIG. 6B illustrates a plan view of a semiconductor device for illustrating a process for manufacturing a semiconductor device according to an embodiment;

FIG. 7A illustrates a cross-sectional view and FIG. 7B illustrates a plan view of a semiconductor device for illustrating a process for manufacturing a semiconductor device according to an embodiment;

FIG. 8A illustrates a cross-sectional view and FIG. 8B illustrates a plan view of a semiconductor device for illustrating a process for manufacturing a semiconductor device according to an embodiment;

FIG. 9A illustrates a cross-sectional view and FIG. 9B illustrates a plan view of a semiconductor device for illustrating a process for manufacturing a semiconductor device according to an embodiment;

FIG. 10A illustrates a cross-sectional view and FIG. 10B illustrates a plan view of a semiconductor device for illustrating a process for manufacturing a semiconductor device according to an embodiment;

FIG. 14A illustrates a cross-sectional view and FIG. 14B illustrates a plan view of a semiconductor device for illustrating a process for manufacturing a semiconductor device according to an embodiment;

DETAILED DESCRIPTION

Figure 1A:
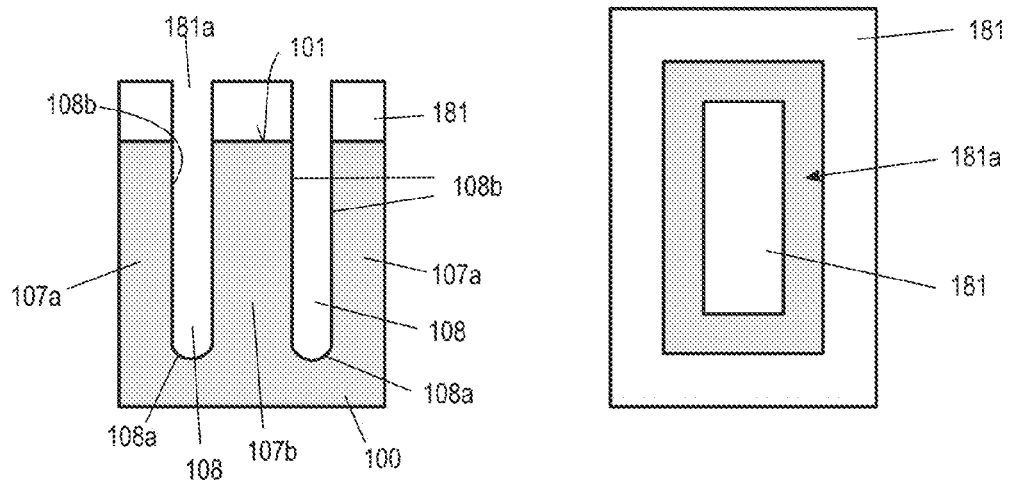
FIGS. 1A to 1D illustrate a process for manufacturing a semiconductor device according to an embodiment.

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing", "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second side or surface of a semiconductor substrate is considered to be formed by the lower surface or back side while a first side or first surface is considered to be formed by the top or main side or surface of the semiconductor substrate. The terms "above" and "below" as used in this specification, likewise "top" and "bottom." therefore describe a relative location of a structural feature to another structural feature with consideration of this orientation. Furthermore, spatially relative terms such as "under", "below", "lower", "over", "upper" and the like, are used for ease of description to explain the positioning of one feature relative to a second feature. These terms are intended to encompass different orientations of the device in addition to different orientations than those depicted in the Figures. Further, terms such as "first", "second", and the like, are also used to describe various features, regions, sections, etc. and are also not intended to be limiting. Like terms may refer to like features throughout the description.

The terms "electrical connection" and "electrically connected" describes an ohmic connection between two features.

Herein, a "normal projection" onto a plane or surface means a perpendicular projection onto the plane or surface. In other words, the view direction is perpendicular to the surface or plane.

The semiconductor substrate can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

N-doped regions are referred to as of first conductivity type while p-doped regions are referred to as of second conductivity type. It is, however, possible to exchange the first and second conductivity type so that the first conductivity type is p-doped and the second conductivity type is n-doped.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIGS. 1A to 1D illustrate processes of a method for manufacturing a semiconductor device. The left illustration of each of the FIGS. 1A to 1D shows a cross-sectional view in a vertical direction and the right illustration of each of the FIGS. 1A to 1D shows a plan view on relevant portions of the semiconductor device.

A semiconductor substrate 100 is provided, which has a first side or first surface 101 formed by the main surface of the semiconductor substrate 100. The semiconductor substrate 100 is typically a monocrystalline substrate which can be formed by a single monocrystalline bulk material or by a monocrystalline base material and a monocrystalline epitaxial layer formed on the monocrystalline base material. The first side 100 can be formed by a specific crystallographic face such as, for example, the <100> face in case of silicon. Other materials can be used as well such as silicon carbide.

According to an embodiment, a first etching mask 181 is formed on the first side 101 of the semiconductor substrate 100, typically in contact with the first side 101. The first etching mask 181 includes one or more openings 181a to define a region or regions where one or more trenches are to be formed during a subsequent etching process. The first etching mask 181 can be made of an organic material such as a resin or photoresist, or can be made of an inorganic material such as an oxide.

Using the first etching mask 181, a trench 108, or trenches 108, are formed using an etching process. Typically, a dry anisotropic etching process such as a plasma-assisted etching process is used to form a trench 108, or trenches, having an aspect ratio of at least 1:1 (depth/width), and particularly of at least 2:1, and more particularly 10:1 and more.

As illustrated in FIG. 1A, the trench 108 has a bottom 108a which can have a concave shape resulting from the etching process. Trench sidewalls 108b extends from the trench bottom 108a to the first side 101 of the semiconductor substrate 100. The trench 108 thus extends from the first side 101 of the semiconductor substrate 100 into the semiconductor substrate 100.

The trench 108 further separates a first mesa region 107a, which is formed in the semiconductor substrate 100 as a result of the previous etching process, from a second mesa region 107b, which is also formed in the semiconductor substrate 100 by the etching process. The first and second mesa regions 107a and 107b thus form the opposite sidewalls 108b of the trench 108.

The trench 108 can be formed to completely laterally surround the second mesa region 107b. The right illustration in FIG. 1A shows a plan view onto the first side 101 of the semiconductor substrate 100. The opening 181a of the mask 181 has a rectangular ring-like shape which shape defines the final shape or layout of the trench 108 as closed ring when seen in plane projection onto the first side 101 of the semiconductor substrate 100. The shape of the trench 108 defined by the opening 181a of the mask 181 can be elongated so that a thin second mesa region 107b is formed when seen in plane projection onto the first side 101. In further embodiments, two concentric ring-shaped trenches 108 are formed defining the second mesa region 107b between the trenches 108. To this end, the first etching mask 181 includes two or more ring-like openings 181a, which are concentric to each other.

In the embodiment shown in FIGS. 1A to 1D, a ring-like formed trench 108 as shown in plain projection onto the first side 101 in the right illustration of FIG. 1A is formed, and the two bottoms 108a shown in the left illustration of FIG. 1A are part of a common button of the ring-like trench 108. The ring-like trench 108 surrounds and define the second mesa region 107b.

According to an embodiment, the second mesa region 107b is laterally completely separated from the first mesa region 107a by the trench 108 or trenches 108.

According to an embodiment, the second mesa region 107b forms, when seen in plane projection onto the first side 101 of the semiconductor substrate 100, a closed ring structure, wherein the second mesa region 107b is laterally bound by an inner trench 108 and an outer trench 108.

Figure 1B:
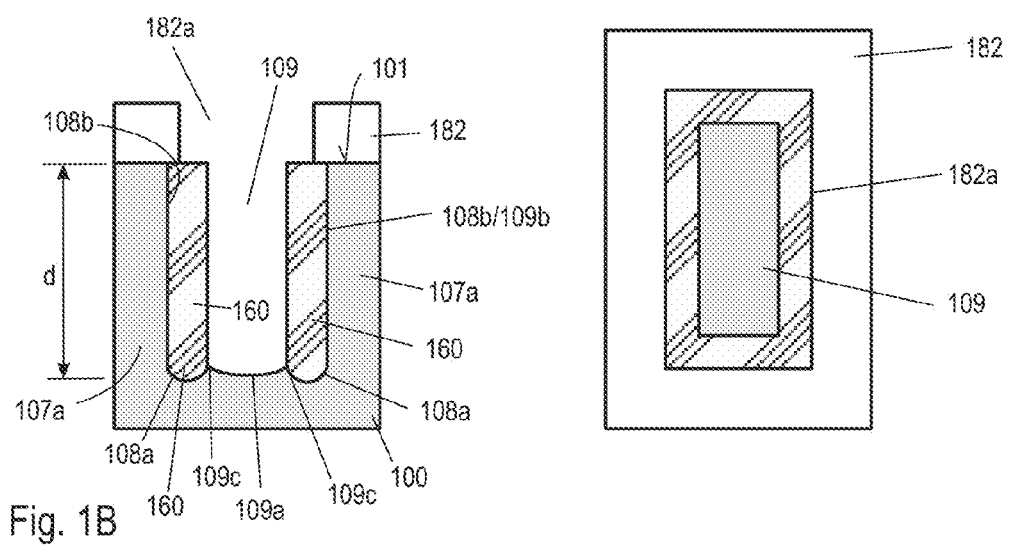

In a further process, as illustrated in FIG. 1B, the trench 108 is filled with an insulating material 160 to cover the bottom 108a and the sidewall 108b of the first trench 108 formed by the first mesa region 107a. In an embodiment, the trench 108 is completely filled with insulating material 160 so that the sidewalls of the first trench 108 are completely covered by the insulating material 160. When the trench 108 completely surrounds the second mesa region 107b, the second mesa region 107b is also completely laterally surrounded by the insulating material 160.

In a further process, as also illustrated in FIG. 1B, the second mesa region 107b is removed, relative to the insulating material 160 filled in the trench 108, by an etching process to form a recess 109 in the semiconductor substrate 100. The recess 109 has at least one side wall 109b formed by the insulating material 160 and a bottom 109a. The bottom 109 has a rounded or concave shape. Respective ridges 109c are formed between the bottom 109a of the recess 109 and the bottoms 108a of the respective trenches 108. The ridges 109s run along the extension of the trenches 108.

The recess 109 and the adjacent trenches 108 form together a merged trench having sidewalls 109b, defined by the outer sidewalls 108b of the respective trenches 108, which are covered by the insulating material 160. A space defined by the recess 109 is formed between opposite layers of insulating material 160. This space basically corresponds to the removed second mesa region 107b.

The merged trench form a trench structure having a first bottom portion that corresponds to the bottom 108a of the trench 108 and a second bottom portion that corresponds to the bottom 109a of the recess 109. The first bottom portion is covered by the insulating material 160 while the second bottom portion remains exposed. Typically, the second bottom portion is laterally completely surrounded by the first bottom portion or first bottom portions.

For removing the second mesa region 107b, an etching process can be used, which can be, for example, an isotropic dry etching process or an isotropic wet etching process. As illustrated in FIG. 1B, the first etching mask 181 is removed and replaced by a second etching mask 182 which covers the first mesa region 107a but leaves the second mesa region 107b uncovered in opening 182a. The opening 182a of the second etching mask 182 is typically wider than the width of the second mesa region 107b to provide for misalignment of the second etching mask 182. The etching process for removing the second mesa region 107b employs the second etching mask 182 to protect the first mesa regions 107a. The first etching mask 181 can be removed prior to filling the trenches 108 with the insulating material 160. Alternatively, the first etching mask 181 can be removed after filling the trenches 108 with the insulating material 160.

The recess 109 has a depth d which can basically correspond to the depth of the trench 108. The depth d of the recess 109, defined as distance between the first side 101 of the semiconductor substrate 100 and the bottom 109a of the recess 109, can be adjusted by controlling the etching time so that the bottom 109a of the recess 109 can be above, below, or substantially at the same level as the bottom 108a of the trenches 108. The depth d can be, for example, at least 500 nm, and in particular at least 800 nm or at least 1200 nm.

A first doping region 116 in a top region 110 of the first mesa region 107a and a second doping region 114 in a portion of the bottom 109a can then be formed, for example by implantation. It would also be possible to form only one of the first and second doping regions 116, 114. The first and second doping regions 116, 114 are typically of the same conductivity type, but can alternatively also of opposite conductivity type.

Figure 1C:
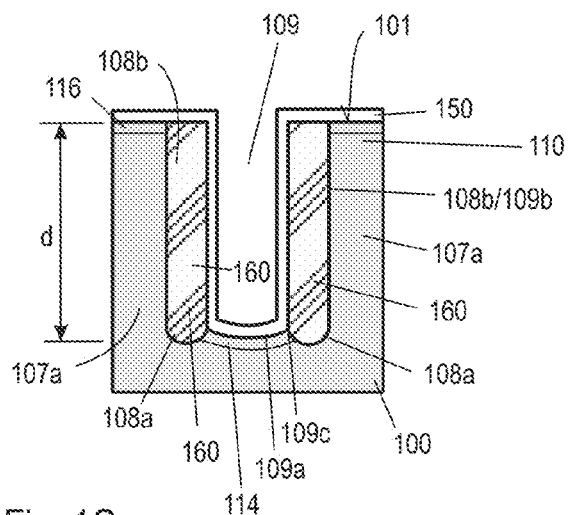
Figure 1D:
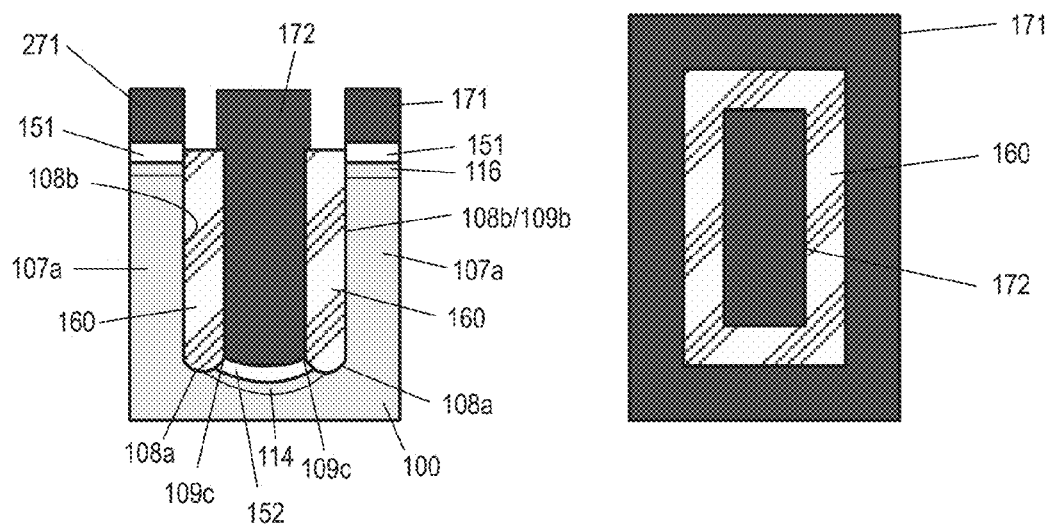

In a common process, as shown in FIGS. 1C and 1D, a first silicide layer 151 is formed on and in contact with the top region 110 of the first mesa region or the first mesa regions 107a at the first side 101 of the semiconductor substrate 100, and a second silicide layer 152 is formed on and in contact with the bottom 109a of the recess 109. If first and second doping regions 116, 114 were formed, the respective silicide layers 151, 152 are in contact with the respective doping regions 116, 114. For example, the first silicide layer 151 can be in contact with the first doping region 116, and the second silicide layer 152 can be in contact with the second doping region 114.

The common process for forming the first and second silicide layers 151, 152 can include, according to an embodiment, depositing a metal liner 150 which includes at least a silicide-forming metal on the first side 101 of the semiconductor substrate 100 and in the recess 109, for example by conformal deposition on the top region 110 of the first mesa region 107a, on exposed portions of the insulating material 160 and on the bottom 109a of the recess 109. FIG. 1C shows that the metal liner 150 is conformably deposited and lines the bottom 109a as well as the exposed regions of the insulating material 160 and the exposed top region 110 of the first mesa region 107a.

The metal liner 150 can be comparably thin, for example having a thickness of between 5 nm and 50 nm. Suitable metals for the metal liner 150 are Ti, Co, Ni, W, Ta, Mo, Pt By depositing the metal liner 150, semiconductor portions, which are exposed at the bottom 109a of the recess 109 and at the top region 110 of the first mesa region 107a, are covered with the metal liner 150. The sidewalls 109b of the merged trench are protected by the insulating material 160 which has a thickness which is sufficient to prevent subsequent reaction between the silicide-forming metal and the semiconductor material of the first mesa region 107a.

Prior to depositing the metal liner 150 a cleaning step can be applied to remove natural oxide films which may have grown on exposed portions of the semiconductor substrate 100.

In a further process as illustrated in FIG. 1D, a thermal treatment is conducted so that the silicide-forming metal of the metal liner 150 reacts with the exposed regions of the semiconductor substrate 100 to form the first and second silicide layers 151, 152. Since the insulating material 160 prevents contact between the metal liner 150 and the sidewalls 109b of the merged trench, i.e. the sidewalls of the first mesa regions 107a that face each other and which are directed to the merged trench, the first and second silicide layers 151, 152 are only formed on or in exposed regions of the semiconductor substrate 100. In the embodiment shown in FIG. 1D, the exposed regions are the top regions 110 of the first mesa regions 107a and the exposed portions of the trench 109a of the recess 109. The sidewalls 109b of the merged trench 109 remain free from silicide layers. Therefore, the first silicide layer 151 formed on and in contact with the top portion 110 of the first mesa region 107a is separated from the second silicide layer 152 formed on exposed portions of the bottom 109a.

The first and second silicide layers 151, 152 are formed in a common process from a common metal liner 150 so that the first and second silicide layers 151, 152 are made of the same material.

The vertical distance between the first silicide layer 151 and the second silicide layer 152 approximately corresponds to the distance d between the first side 101 of the semiconductor substrate 100 and the bottom 109a of the recess 109. This vertical distance can be, for example, at least 500 nm, and in particular at least 800 nm. In further embodiments the vertical distance can be, for example, at least 1000 nm and in particularly at least 1500 nm.

The thermal treatment that is suitable for reacting the silicide-forming metal of the metal liner 150 with the exposed regions of the semiconductor substrate 100 can include annealing the metal liner 150 in an inert atmosphere at a temperature of about 300° C. to about 1000° C. for about 10 second to about 180 minutes.

After conducting the thermal treatment, unreacted silicide-forming metal which remained on the formed silicide layers 151, 152 and on the insulating material 160 is removed. This removal can include removal of an ohmic electrical connection between the first silicide layer 151 and the second silicide layer 152 by the metal liner 150. This ohmic disconnection provides separate electrical connections to different doping regions which can be formed prior to the formation of the silicide layers 151, 152 at the bottom 109a of the recess 109 and at the top region 110 of the first mesa region 107a, respectively.

Since the insulating material 160 covers the sidewalls of the first mesa regions 107a and also the bottoms 108a of the trenches 108, no silicide layers are formed in the semiconductor material 100 in these regions. In the embodiment illustrated in FIGS. 1A to 1D, the second silicide layer 152 therefore extends approximately between the ridges 109c formed between the bottoms 108a of the trenches 108 and the bottom 109a of the recess 109, respectively.

Depending on the temperature and duration of the thermal treatment, the second silicide layer 152 can also partially extend below the insulating material 160 and thus occupies portions of the bottoms 108a of the trenches 108 directly adjacent to the ridges 109c. Typically, the second silicide layer 152 does not occupy a large portion of the bottoms 108a of the trenches 108 and remain laterally spaced from the sidewalls 108b of the trenches 108, which also form the sidewalls of the first mesa regions 107a.

The first silicide layer 151 typically completely covers the previously exposed top portion 110 of the first mesa regions 107a and laterally extends up to the sidewalls of the first mesa region 107a.

In a further process, as illustrated in FIG. 1D, a common metal layer is deposited on and in contact with the first silicide layer 151 and on and in contact with the second silicide layer 152. The common metal layer typically fills the recess 109, overfills the top portion of 109 and covers the insulating material 160. Voids and seams may remain at the bottom of the recess 109 depending on the selected conditions. The common metal layer therefore completely covers the first side 101 of the semiconductor substrate 100 and can form a substantially plane surface. To improve planarity of the common metal layer a polishing step such as a chemical-mechanical polishing (CMP) can be carried out after the deposition of the common metal layer.

By using a mask layer formed on the common metal layer for defining first and second regions, the common metal layer is etched using the mask layer as etching mask to form a first metal layer 171 on and in contact with the first silicide layer 151 and a second metal layer 172 on and in contact with the second silicide layer 152. This etching can also include ohmic disconnecting the first metal layer 171 from the second metal layer 172 so that electrically and structurally separate metal contacts are formed on and in contact with the respective first and second silicide layers 151 and 152. The first metal layer 171 and the second metal layer 172 are spaced apart from each other and are typically not in contact with each other.

The processes described above thus allow formation of separate silicide layers at different levels by a first common process. The separate silicide layers 151, 152 can be vertically spaced from each other by a distance of at least 500 nm, which distance is defined by the depth d of the recess 109, or more generally, by a step formed at the first side 101 of the semiconductor substrate 100. The separate silicide layers can be in contact with different doping regions which are spaced from each other, so that a low electrical contact resistance to different doping regions arranged at different levels can be provided.

The processes further allow formation of separate metal layers 171, 172 by a second common process after the first common process for forming the separate silicide layers 151, 152. The separate metal layers 171, 172 are formed by structuring a common metal layer using a mask-assisted anisotropic etching process such as an RIE etching process. The separate metal layers 171, 172, i.e. the first metal layer 171 and the second metal layer 172, provide respective ohmic contacts to the first silicide layer 151 and to the second silicide layer 152 and can therefore also be described as contact structures for contacting silicide regions or doping regions which include this silicide layers for reducing the contact resistance to the contact structures.

At least one of the contact structures, in the embodiment shown in FIGS. 1A to 1D the contact structure that is formed by the second metal layer 172, is formed as pillar or fin that extends from the second silicide layer 152 at the bottom 109b of the recess 109 to above the first side 101 of the semiconductor substrate 100. An electrical contact can thus be provided to a doping region which is spaced from the first side 101 of the semiconductor substrate 100 by the depth d. A lateral electrical insulation between the second metal layer 172 and the first mesa regions 107a is provided by the insulating material 160 which was filled into the previously formed trenches 108. In further embodiments, the insulating material 160 is removed and replaced by other insulating structures.

According to an embodiment, the second metal layer 172 has a larger thickness than the first metal layer 171 and extends from the second silicide layer 152 to above the first side 101 of the semiconductor substrate 100.

According to an embodiment, a semiconductor device having a semiconductor substrate 100 with a first side 101 is provided. The semiconductor substrate 100 includes a trench structure 108, 109 having a bottom 108a, 109a and a sidewall 109b. The trench structure can be formed as described above by forming first a plurality of trenches 108 and subsequently removing selected trenches. Each trench structure includes a bottom having at least a first bottom portion 108a and a second bottom portion 109a laterally adjacent to the first bottom portion 108a. Each of the first and second bottom portions 108a, 109a have a concave shape with a ridge 109c formed between the first and second bottom portions 108a, 109a.

An insulating material 160 covers the sidewalls 109b and the first bottom portion 108a of the recess 109 while leaving the second bottom portion 109a of the recess 109 uncovered. A mesa region 107a extends to the first side 101 of the semiconductor substrate 100 and forms the sidewall 109b of the trench structure 108, 109.

A first silicide layer 151 is disposed on a top region 100 of the mesa region 107a, and a second silicide layer 152 is disposed on the second bottom portion 109a of the trench structure 108, 109. A first metal layer 171 is disposed on and in contact with the first silicide layer 151, and a second metal layer 172 is disposed on and in contact with the second silicide layer 152.

With reference to FIGS. 2 to 5 embodiments of semiconductor devices, which are vertical power semiconductor devices, are described.

Figure 2:
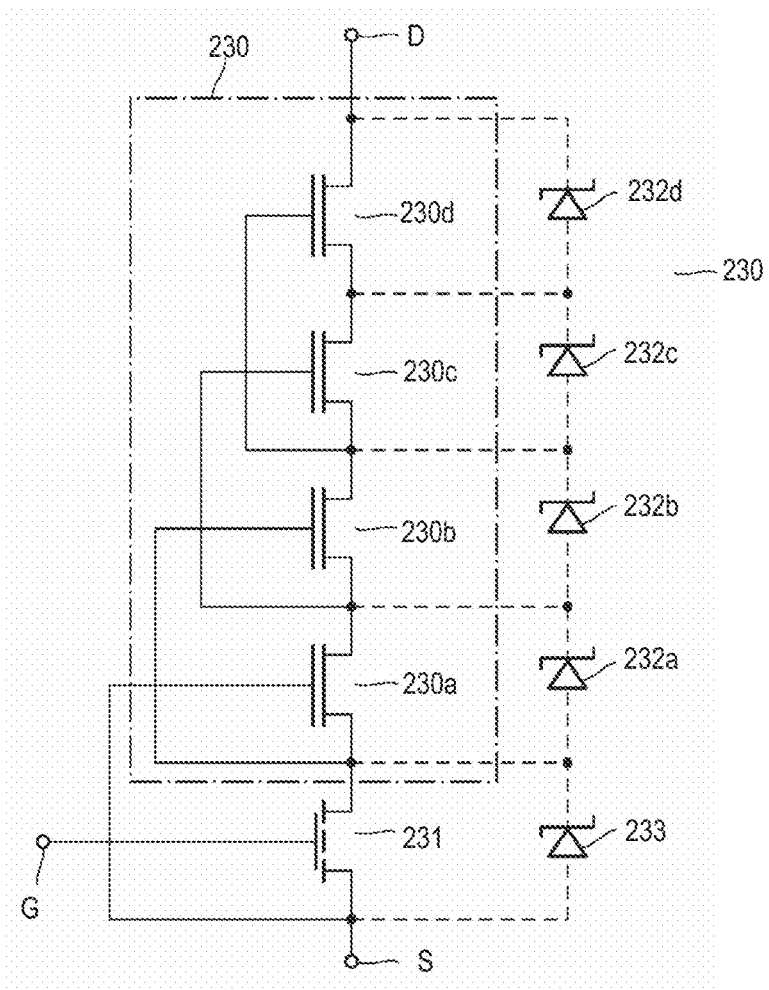
FIG. 2 illustrates a semiconductor device according to an embodiment.

FIG. 2 shows an equivalent circuit diagram of a semiconductor device 230 according to an embodiment. The semiconductor device 230 comprises an enhancement transistor 231 (normally-off transistor) and a plurality of depletion transistors 230a to 230d (normally-on transistors). The enhancement transistor 231 comprises a gate electrode, a drain region and a source region. The gate electrode G of the enhancement transistor 231 is also the control gate for the semiconductor device 230. The enhancement transistor 231 and the depletion transistors 230a to 230d are integrated in a common semiconductor substrate.

When a suitable voltage is applied to the gate electrode G, the enhancement transistor 231 is rendered conductive. The plurality of the depletion transistors 230a to 230d are connected in series with each other and to the enhancement transistor 231. The entirety of the depletion transistors 230a to 230d can be considered to act as a drift zone 237 of the enhancement transistor 231. In this case, the terminal D can be regarded as a drain terminal of the power semiconductor device 230. The terminal S, which is connected with the source of the enhancement transistor 231, acts as source of the semiconductor device 230.

As shown in FIG. 2, the voltage appearing at the drain of the depletion transistor 231 is applied to the gate of the depletion transistor 230b. The voltage appearing at the source of the depletion transistor 231 is applied to the gate of the transistor 230a. Each of the depletion transistors 230c to 230d has its gate electrode connected to the drain of another depletion transistor 230a to 230b which is arranged two positions in the series before the respective depletion transistors 230c to 230d. Therefore, the output of any transistor 231, 230a to 230d in the series determines the gate voltage which is applied to a transistor at a later position within the series. The semiconductor device 230 thus formed is a so-called ADZFET ("active drift zone field effect transistor") having a controllable drift zone formed by the depletion transistors 230a to 230d.

The semiconductor device of FIG. 2 illustrates four depletion transistors 230a to 230d and one enhancement transistor 231. While the semiconductor device typically includes one enhancement transistor 231, the number of the depletion transistors 230a to 230d is not limited and can be adapted in view of the desired blocking voltage.

The semiconductor device 230 can additionally comprise a plurality of clamping elements 233, 232a to 232d, wherein each of the clamping elements is connected in parallel to each of the transistors 231 and 230a to 230d. An overvoltage protection for the respective transistor 231 and 230a to 230d is provided by the clamping elements 233, 232a to 232d. The clamping element can be Zener diodes or other suitable elements such as PIN diodes, tunnel diodes, avalanche diodes or the like. The clamping elements 233, 232a to 232d are optional.

Each of the transistors 231, 230a to 230d is capable of blocking a given voltage such as, for example, 20 V. Due to the series connection, the total blocking voltage of the semiconductor device 230 is much larger and approximately equal to the blocking voltage of each transistor 231, 230a to 230d multiplied by the number of the transistors 231, 230a to 230d. It is thus possible to form a power semiconductor device 230 capable of blocking large voltages by a series of transistors each being capable of blocking a much lower voltage. Since the blocking voltage which each of the transistors 231, 230a to 230d has to withstand is moderate, the device requirements are not as demanding as for a single transistor which would need to block a much higher voltage.

The transistors 231, 230a to 230d are also referred to as semiconductor elements herein.

Figure 3:
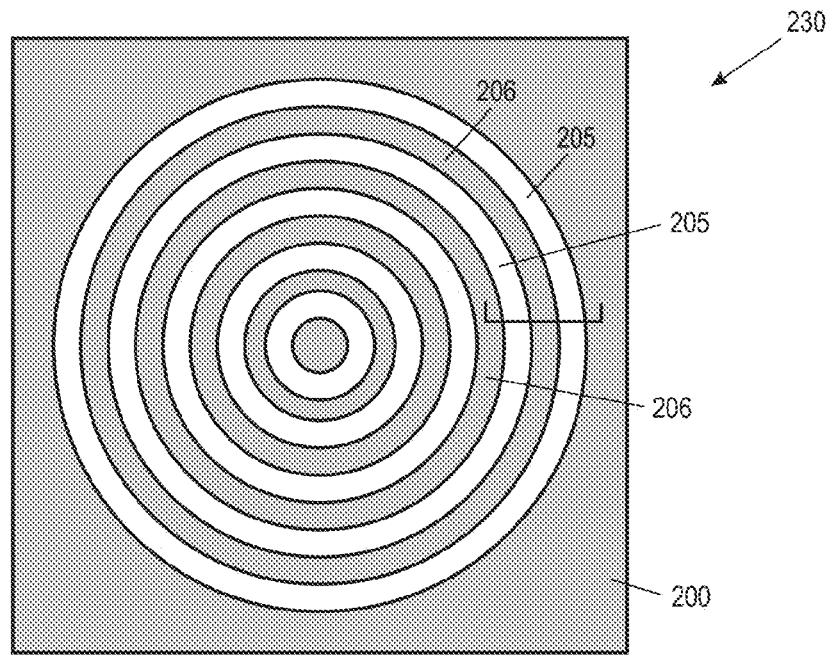
FIG. 3 illustrates a plan view on a semiconductor device according to an embodiment.
Figure 4:
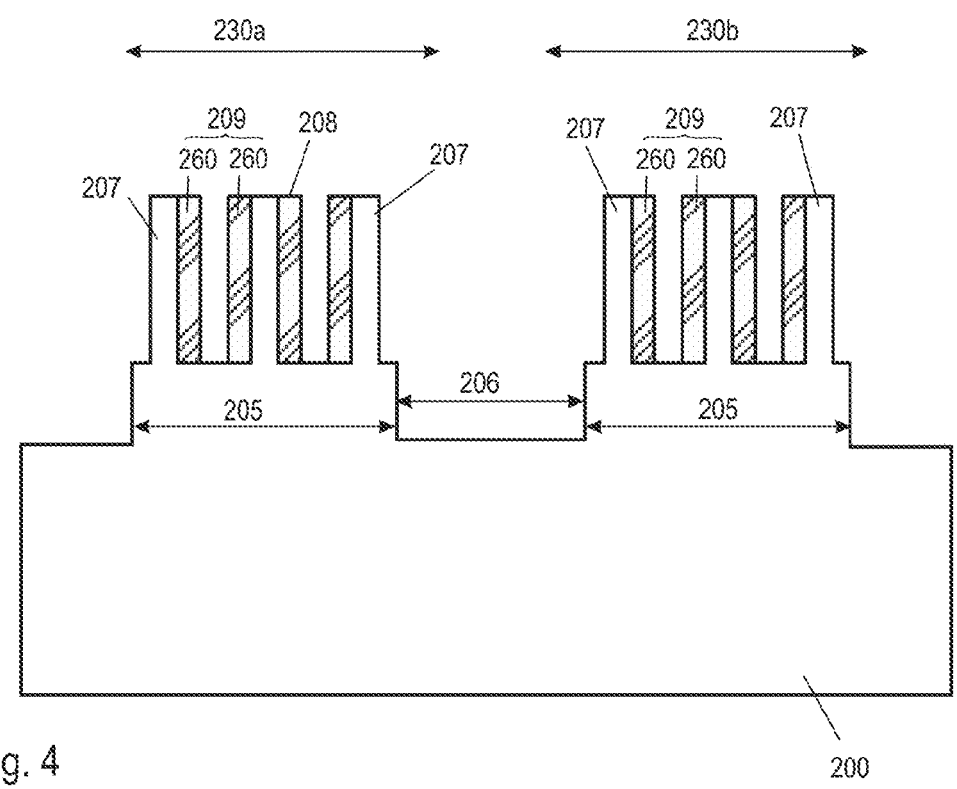
FIG. 4 illustrates a cross sectional view of a portion of the semiconductor device of FIG. 3.

FIG. 3 illustrates a plan view onto a semiconductor device 230 which includes a plurality of concentric element mesa regions 205 which are laterally separated from each other by respective element separating trenches 206. FIG. 4 illustrates a cross-sectional view through two adjacent element mesa regions 205 separated by an element separating trench 206. In each of the element mesa regions 205 a respective semiconductor element 230a and 230b is integrated. Each element mesa region 205 includes first mesa regions 207 and merged trenches 209 formed between, and laterally separating, adjacent first mesa regions 207. Each of the first mesa regions 207 forms a closed ring-like structure when seen in plane projection onto the first side 201 of the semiconductor substrate 200.

For illustration purposes, FIG. 4 only illustrates the merged trenches 209 with the insulating material 260 formed on the sidewalls of the adjacent first mesa regions 207.

Figure 5:
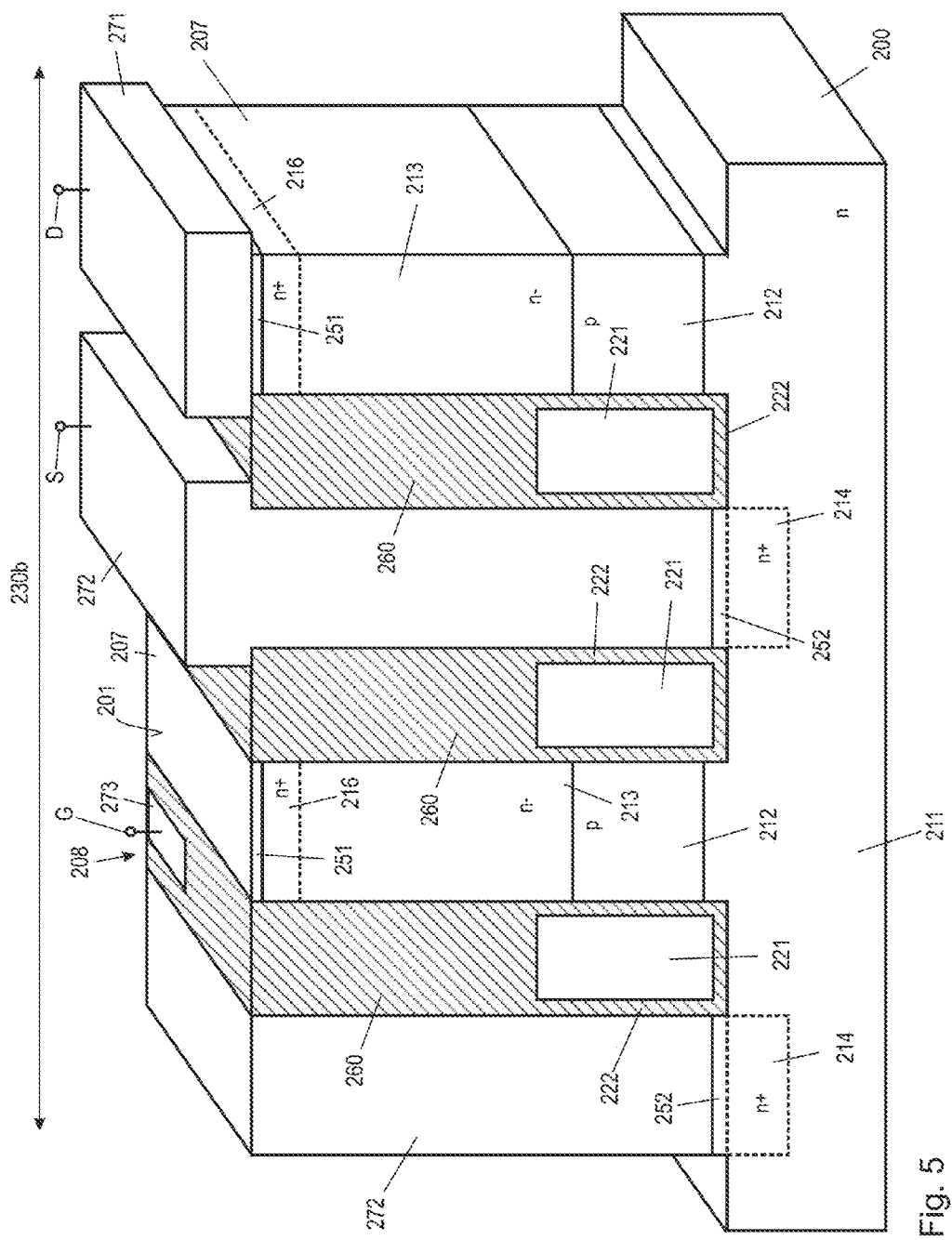
FIG. 5 illustrates a 3-dimensional view of a portion of a semiconductor device according to an embodiment described herein.

FIG. 5 illustrates a portion of a single semiconductor element 230b.

The first side 201 of the semiconductor substrate 200 is shown to be formed by the upper side of the first mesa regions 207. Each of the first mesa regions 207 forms a respective fin of the semiconductor element 230a. Between adjacent first mesa regions 207, trenches 208 which are filled with insulating material and which includes respective gate electrodes 221, and a second metal layer 272 forming a contact structure are arranged. Typically, the first mesa regions 207 and the second metal layer 272 form an alternating arrangement of conductive source contacts and mesa regions 207, in which body regions 212, drift regions 213 and drain regions 216 are formed. A first mesa region 207 and an adjacent second metal layer 272 form together a single cell of the semiconductor element 230a. Hence, each of the semiconductor elements 230a to 203d can include a plurality of transistor cells each having one mesa region and a source contact, wherein both the mesa region and the source contact have a fin-like shape.

The semiconductor elements can also be formed by other types of the FETs such as IGBTs. In this case, the drain region is replaced by an emitter region of opposite conductivity type.

The second metal layer 272, which form respective source contacts, can be made of highly doped semiconductor material or of metal or metal alloy. The source contact extend from the first side 201 to respective second silicide layer 152 formed at the bottom of the merged trench. The second silicide layers 252 are in contact with highly doped source contact regions 214 integrated into the semiconductor substrate 200 at the bottom of the merged trenches as described above.

The first mesa regions 207 are made of semiconductor material. The first mesa regions 207 can be bulk material or formed by epitaxial deposition followed by etching. As illustrated in FIG. 5, p-doped body regions 212, weakly n-doped drift regions 213, and highly n-doped drain regions 216 are formed in this order from a lower end of the first mesa region 207 to the first side 201. The doping relations can also be reversed and are not limited to the specific embodiments illustrated herein.

Gate electrodes 221 are formed between any two adjacent first mesa regions 207. More specifically, a gate electrode 221 is arranged laterally between a body region 212 integrated into the first mesa region 207 and the second metal layer 272 forming the source contact. The gate electrodes 221 are insulated from the semiconductor substrate 200, more specifically from the source region 211, the first mesa regions 207 and the second metal layer 272 by a gate dielectric 222.

When a voltage above a given threshold voltage is applied to the gate electrodes 221, an enhancement channel is formed in the body region 212 along the gate dielectric between the source region 211 and the drift region 213 in case of an enhancement device. In case of a depletion device, the intrinsically formed channel is depleted when the gate voltage exceeds (i.e. is more negative in case of an n-channel MOSFET) a given threshold voltage, and thus, the ohmic connection between the source region 211 and the drift region 213 is interrupted.

As illustrated in FIG. 5, the second metal layer 272 forms a source metallization that extends to and projects above the first side 201 of the semiconductor substrate 200. Furthermore, a drain metallization 271 is formed on the first side 201 of the semiconductor substrate 200 and in contact with drain regions 216. The drain metallization 271 is formed by the first metal layer described above. FIG. 5 also illustrates a gate metallization 273 which is in ohmic connection with the gate electrodes 221. For illustration purposes only, the top part of the first and second metal layers 271, 272 are removed in the left part of FIG. 5.

Since each of the transistor cells only needs to block a comparably low voltage, such as 20 V, the blocking capabilities are not demanding. This improves the reliability of the semiconductor device 230. Therefore, the insulation between the gate electrode 221 and the source contact formed by the second metal layer 272 can be provided by the comparably thin gate dielectric that is also arranged between the gate electrode 221 and the adjacent body region 212.

In the embodiments illustrated in FIGS. 2 to 5 the previously formed second mesa regions are not shown as they are removed and replaced by the second metal layer 272 which form respective source contacts.

With reference to FIGS. 6 to 14 processes for forming semiconductor devices according to an embodiment are described in more detail. The Figures nominated by A illustrate a cross-sectional view and the Figures nominated by B illustrate a top or plan view of a portion of a semiconductor substrate into which the semiconductor devices are integrated.

Similar as in the embodiments described above, a semiconductor substrate 300 having a first side 301 which is formed by the top or main side of the semiconductor substrate 300 is provided. The semiconductor substrate 300 can be, for example, formed by an n-doped epitaxial layer arranged on a bulk semiconductor material or just the bulk material. Portions of the epitaxial layer or the bulk material will later form respective source regions of the semiconductor devices.

A first etching mask 381 is formed on the first side 301 of the semiconductor substrate 300. The first etching mask 381 includes openings 381a. As best shown in FIG. 6B, the first etching mask 381 includes bar- or stripe-like mask portions which are surrounded by the opening 381a. The bar-like mask portions define the size and location of the subsequently formed first and second mesa regions 307a and 307b.

Typically, the first and second mesa regions 307a and 307b will have the same size and will be spaced from each other at a given pitch. Forming the first and second mesa regions 307a and 307b as a regular structure facilitates mask formation and the etching process.

As best shown in FIG. 6A the semiconductor substrate 300 is etched using an anisotropic etching process to form trenches 308 that separate the first and second mesa regions 307a and 307b from each other. Each of the trenches 308 has a bottom 308a and respective sidewalls 308b which corresponds to respective sidewalls of the respective first and second mesa regions 307a and 307b. As shown in FIG. 6B, the trenches form a trench structure that surrounds the first and second mesa region 307a and 307b.

Typically, a plurality of trenches 308 are etched which extend from the first surface or first side 301 of the semiconductor substrate 300 into the semiconductor substrate 300 so that a plurality of first and second semiconductor mesa regions 307a and 307b are defined which extend to the first surface or first side 301. Between two adjacent trenches 308 a respective semiconductor mesa region 307a, 307b is arranged. The first and second semiconductor mesa regions 307a, 307b are typically completely laterally separated by the trenches 308.

After removal of the first etching mask 381, the trenches 308 are filled with an insulating material 360 as illustrated in FIGS. 7A and 7B or with layers of different materials which completely overfill the trenches. One or more of the insulating material 360 can also completely cover the first side 301 of the semiconductor substrate 300. Suitable materials used as insulating material are inorganic oxides or nitrides such as silicon oxide or nitride or organic materials such as resins or carbon. Material for conducting or embedded conducting layers can contain amorphous or poly silicon, metals like TiN or W.

The insulating material 360 can be etched back to expose the first side 301 of the semiconductor substrate 300 until the top region of the first and second mesa regions 307a and 307b become exposed as best shown in FIG. 8A. The trenches 308 remain filled with the insulating material 360 that forms spacers 361 which cover the sidewalls of the trenches 308 and the first and second mesa regions 307a and 307b.

As shown in FIGS. 9A and 9B the second etching mask 382 is then formed on the first side 301 of the semiconductor substrate 300 to cover the first mesa regions 307a while leaving the second mesa regions 307b uncovered in openings 382a of the second etching mask 382. The openings 382a can be larger, when seen in plane projection onto the first side 301, than the second mesa regions 307b with the edges of the openings 382a being spaced from the second mesa regions 307b. The second etching mask 382 and the insulating material 360 in the trenches 308 form together a common etching mask for a subsequent selective removal of the second mesa regions 307b. The selective removal of the second mesa regions 307b results in the formation of merged trenches 309 which include the trenches 308 filled with the insulating material 360 and respective recesses. Each merged trench 309 includes sidewalls 309b and a bottom 309a that extends between opposite sidewalls 309b.

As shown in FIG. 9A, a central portion of the bottoms 309a remain uncovered while outer portions of the bottoms 309a are covered by the spacers 361 formed by the insulating material 360 which remained in the trenches 308.

Turning to FIGS. 10A and 10B, a first process for forming doping regions are described. A first implantation mask 391 is formed in a first device region 341 while leaving a second device region 342 of the semiconductor device uncovered. Dopants are then implanted into uncovered top regions of the first mesa regions 307a in the second device region 342 and in the exposed portions of the bottom 309a of the merged trench 309 in the second device regions 342. By this first implantation process, n-type doping regions 314a and 316a are formed. The doping regions 316a, which are formed in top portions of the exposed first mesa regions 307a, are referred to as first doping regions of the first conductivity type while the doping regions 314a, which are formed in exposed bottom portions of the merged trench 309, are referred to as second doping regions of the first conductivity type. The first doping regions 316a will later form respective drain regions while the second doping regions 314a will later form source contact regions.

Figure 11B:
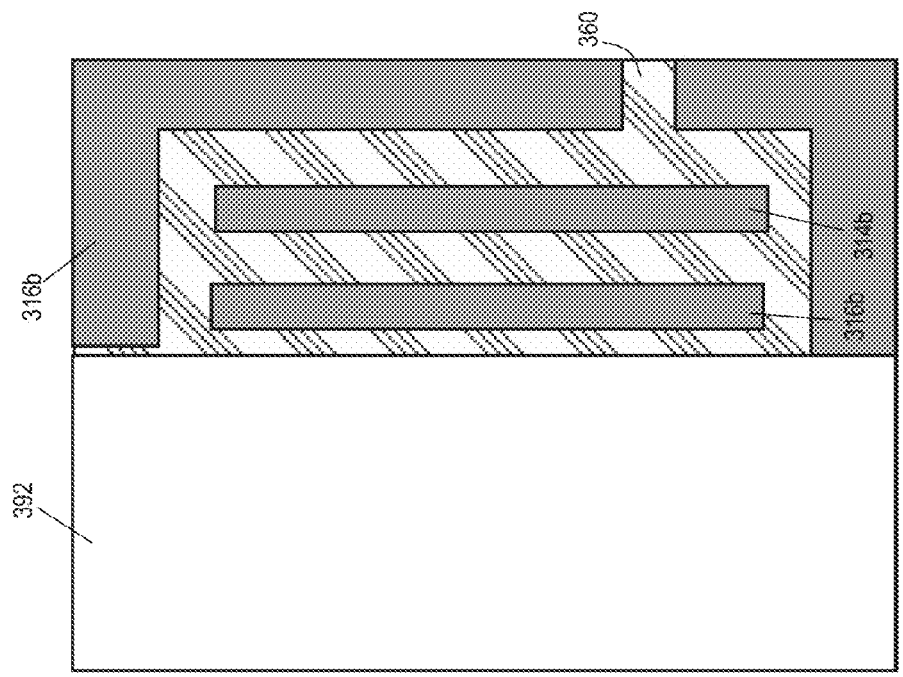
FIG. 11A illustrates a cross-sectional view and FIG. 11B illustrates a plan view of a semiconductor device for illustrating a process for manufacturing a semiconductor device according to an embodiment.
Figure 11A:
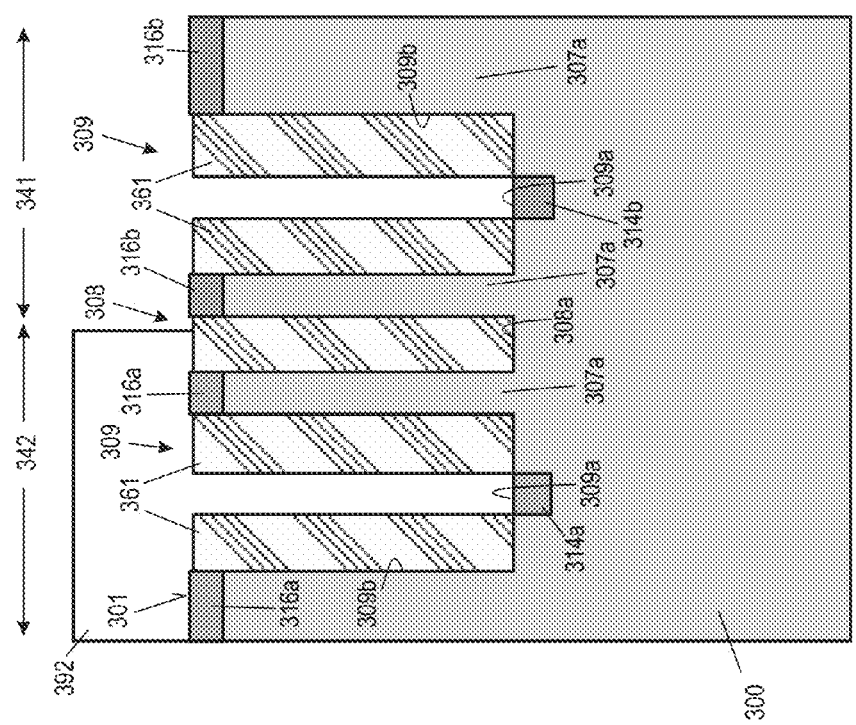

As illustrated in FIGS. 11A and 11B, the first implantation mask 391 is removed and a second implantation mask 392 is formed to cover the second device region 342 while leaving the first device region 341 uncovered. The first and second implantation mask 391, 392 can be formed to be complementary with each other.

Using a further implantation process, for example to implant p-type dopants, first and second doping regions 314b, 316b are formed in the exposed top regions of the first mesa regions 307a and bottom regions 309a of the merged trenches 309 of the first device region 341. These doping regions 314b, 316b are of the second conductivity type and are referred to as first and second doping regions of the second conductivity type.

FIGS. 11A and 11B illustrate integration of semiconductor elements of opposite conductivity type into a semiconductor device, with a first semiconductor element integrated into the first device region 341 and a second semiconductor element integrated into the second device region 342. If semiconductor elements of opposite conductivity type are not needed, then a single implantation process can be applied and formation of the first and second implantation mask 391, 392 can be dispensed with.

The first device region 341 can also be described as having a plurality of first mesa regions and first trenches 308, wherein at least one first semiconductor mesa region between two adjacent first trenches is removed so that the two adjacent first trenches merge and form a first common trench. The first device region 342 can also be described as having a plurality of second mesa regions and second trenches 308, wherein at least one second semiconductor mesa region between two adjacent second trenches is removed so that the two adjacent second trenches merge and form a second common trench 309. The common trench 309 shown in the first device region 341 forms for example a first common trench and the common trench 309 shown in the second device region 342 forms for example a second common trench. The FIGS. 10A, 10B, 11A and 11B therefore also illustrate that first doping regions 316a of a first conductivity type are formed, adjacent to the first common trench, in remaining first mesa regions in the first device region 341 and that second doping regions 314a of the first conductivity type are formed in a bottom portion of the first common trench in the first device region 341. Furthermore, first doping regions 316b of a second conductivity type are formed, adjacent to the second common trench, in remaining second mesa regions in the second device region 342, and second doping regions 314b of the second conductivity type are formed in a bottom portion of the second common trench in the second device region 342.

Figure 12B:
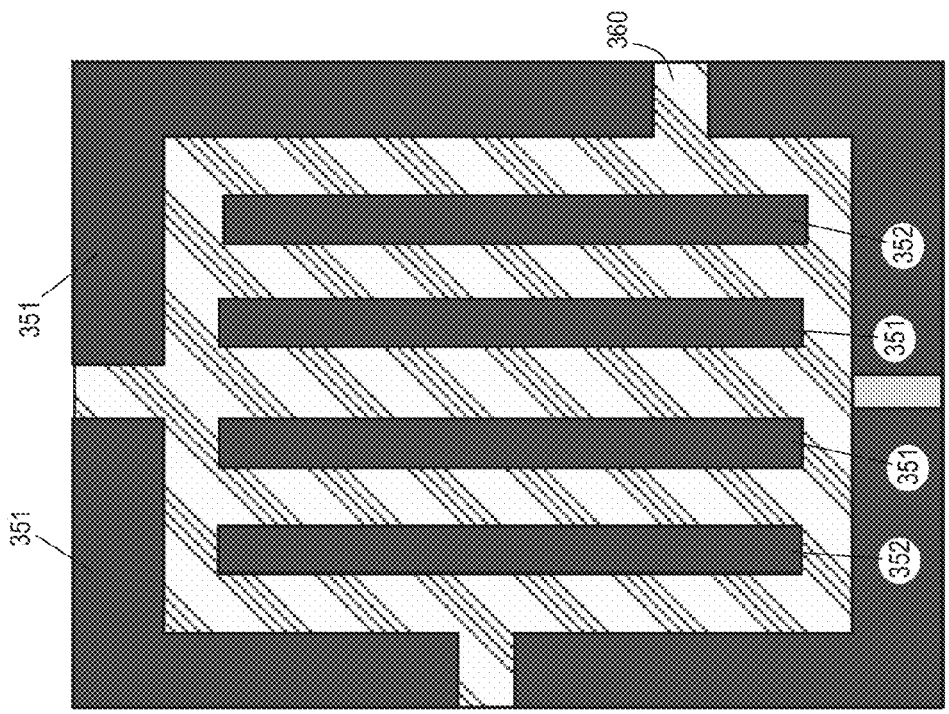
FIG. 12A illustrates a cross-sectional view and FIG. 12B illustrates a plan view of a semiconductor device for illustrating a process for manufacturing a semiconductor device according to an embodiment.
Figure 12A:
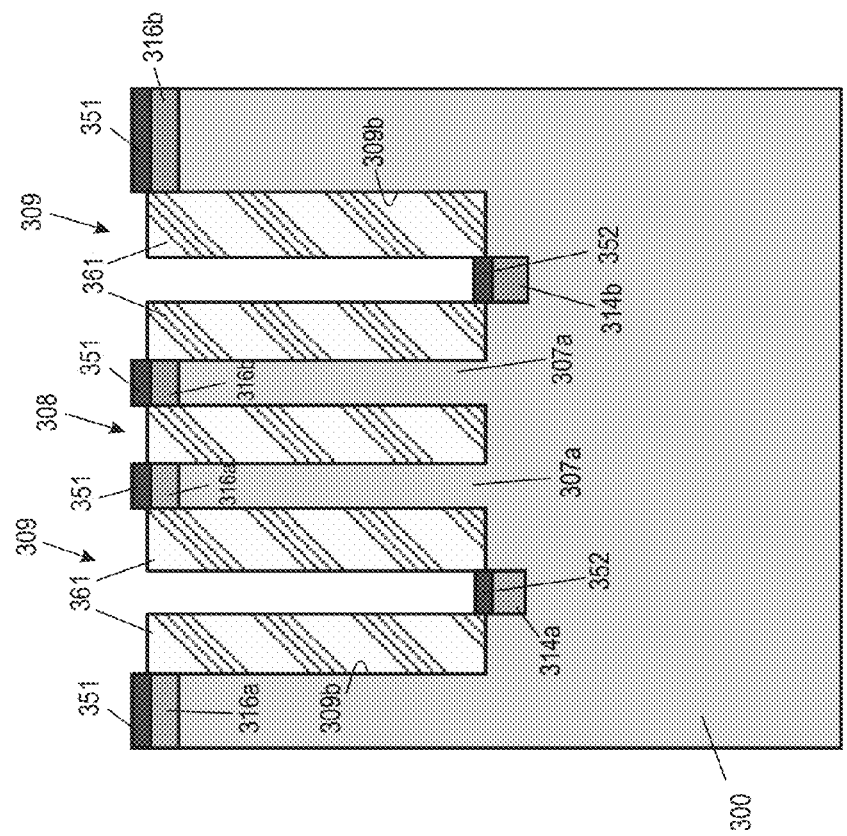

After removal of the second implantation mask 392 first silicide layers 351 are formed on and in contact with the first doping regions 316a, 316b at the first side 301 of the semiconductor substrate 300 and second silicide layers 352 are formed on and in contact with the second doping regions 314a, 314b at the exposed bottom portions 309a of the merged trenches 309, as illustrated in FIGS. 12A and 12B. The first and second silicide layers 351 and 352 can be formed as described in connection with the FIGS. 1A to 1D by first depositing a common metal liner having a silicide-forming metal which is then subjected to a thermal treatment to allow reaction of the silicide-forming metal with the exposed portions of the semiconductor substrate 300.

Figure 13B:
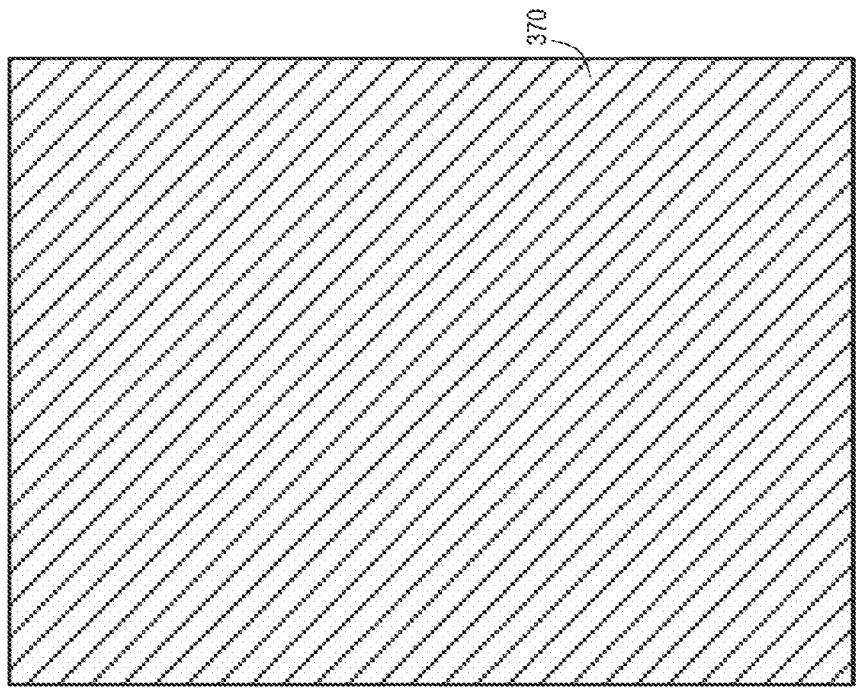
FIG. 13A illustrates a cross-sectional view and FIG. 13B illustrates a plan view of a semiconductor device for illustrating a process for manufacturing a semiconductor device according to an embodiment.
Figure 13A:
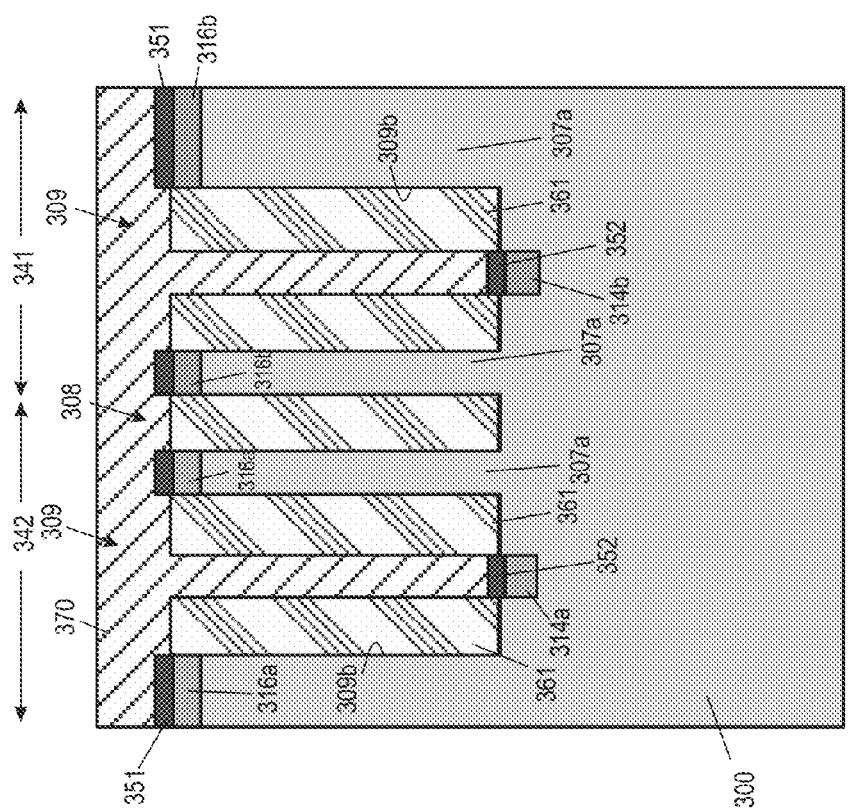

As illustrated in FIGS. 13A and 13B a common metal layer 370 is deposited which completely fills the merged trenches 309 to extend to the second silicide layers 352 at the bottoms 309a of the merged trenches 309. The deposition of the common metal layer 370 can include deposition of a first liner such as a Ti, TaN, TiN/Ti or WN followed by the deposition of a metal material like W, Cu or an aluminum-containing alloy such as AlSiCu.

In further processes, as illustrated in FIGS. 14A and 14B, a third etching mask 383 is formed on a top side of the common metal layer 370 defining the size and location of first and second metal layers 371, 372.

The first metal layers 371 are formed to be on and in contact with the first silicide layers 351, and the second metal layers 372 are formed to be on and in contact with the second silicide layers 352. As shown in FIG. 14A, the second metal layer 372 extends from the bottom of a respective merged trench 309 to above the first side 301 of the semiconductor substrate 300. The second metal layer 372 forms a pillar-like contact structure that allows to contact the second doping regions 314a, 314b formed at the bottoms 309a of the merged trenches 309. In the final semiconductor device, the second metal layer 372 functions as source contact. The first metal layer 371 also forms a contact structure which provides an ohmic connection to the first doping regions 316a, 316b at the top portion of the first mesa regions 307a. In the final semiconductor device, the first metal layer 37a is used as drain contact.

The first and second metal layers 371, 372 are structured such that they form separate and disparate metallic structures each of which for connecting a different doping region.

Figures 15A, 15B:
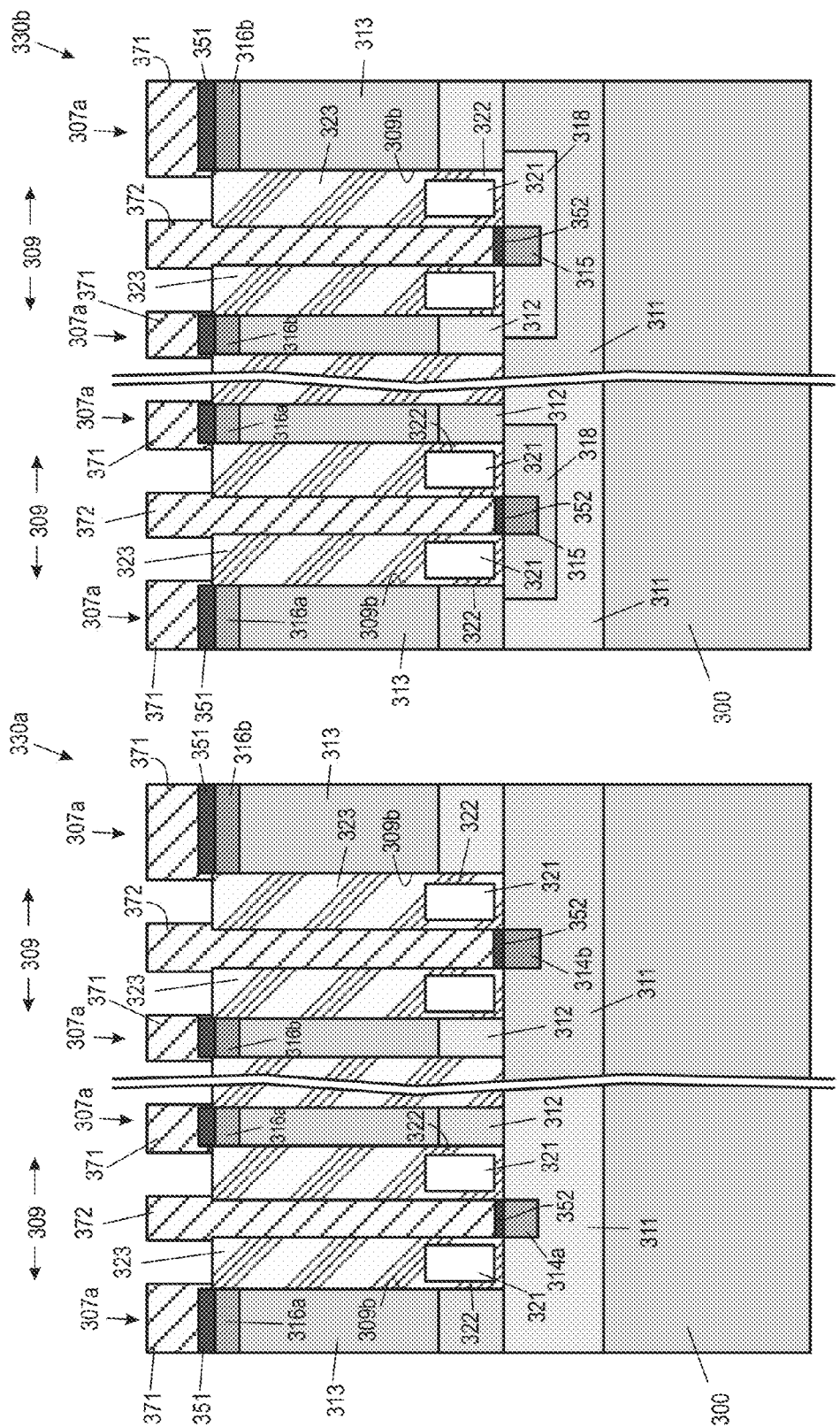
FIG. 15A illustrates a cross-sectional view and FIG. 15B illustrates a plan view of a semiconductor device for illustrating a process for manufacturing a semiconductor device according to an embodiment.

FIGS. 15A and 15B illustrate the structure of a final semiconductor device 330a. The semiconductor device 330a is an enhancement device. FIG. 15B illustrates a modification of the structure of the semiconductor device 330a to provide a body contact structure 330b for providing electrical contact to the body region. The structure of the semiconductor device is explained relative to the semiconductor device 330a shown in FIG. 15A, and then the differences between FIGS. 15A and 15B are explained.

The semiconductor device 330a and the body contact structure 330b are typically integrated in a common semiconductor substrate 300. The left and right parts of FIGS. 15A and 15B illustrate modifications with regard to the conductivity type of the semiconductor devices. For power devices, typically so-called n-channel devices are used, which include an n-doped source region 311, a p-doped body region 312, a highly n-doped drift region 313, and a highly p-doped drain region 316. The body region 312, the drift region 313 and the drain region 316 are formed in the first mesa region 307a as described above. The source region 311 is formed below the first mesa region 307a and the merged trenches 309. For improving ohmic contact between the source region 311 and the metallic source contact formed by the second metal layer 372, a highly n-doped source contact region 314 is formed at the bottom of the merged trench 309 which is covered with a second silicide layers 352 disposed the source contact region 314 and the second metal layer 372.

For example, the left part of each of the FIGS. 15A and 15B illustrates the doping relations of an n-channel device 330a and the right part of each of the FIGS. 15A and 15B illustrate the doping relations of a body contact structure 330b.

FIGS. 15A and 15B also illustrate that the insulating material 360 disposed between the second metal layer 372 and the sidewalls 309b of the merged trench 309 includes a gate dielectric, or first insulating layer, 322, a gate electrode 321, and an insulating layer, or second insulating layer, 323 above the gate electrode 321. This layer stack can include a conducting layer forming respective gate electrodes 321 which are formed adjacent to the body region 312.

Typically, the insulating material 360 can include several or at least two insulating layers and at least one conductive layer arranged between the at least two insulating layers. The above mentioned layer stack can be formed, for example, during the processes as shown in FIGS. 8A and 8B. For sake of ease of understanding, the formation of this layer stack has not been shown in the FIGS. 8A and 8B. The layer stack includes the gate electrode as described below. The insulating material 360 can therefore include the gate dielectric 322, gate electrode 321, and second insulating layer 323 above the gate electrode 321. It would also be possible to form the layer stack at a later stage, for example by removing the insulating material 360 and then forming the layer stack.

For example, first a dielectric layer (a first insulating layer 322) can be conformally deposited in the trenches 308, which dielectric layer 322 forms, with optional oxidation or annealing steps, the gate dielectric layer 322. In a further step, a conductive material such as polysilicon is deposited to completely fill the remaining opening of the trenches 308. With a gate recess process, e.g. an isotropic polysilicon etch, the gate electrode 321 is formed. The gate dielectric layer 322 typically remains on the sidewalls of the trenches 308 and protects the semiconductor material of the first mesa regions 307a. To cover the gate electrode 321 with a dielectric material, a second insulating layer 323 is deposited to completely fill the trenches 308 forming, together with the first insulating layer 321, insulating material 360, which can be planarized to the first side 301 as described before. This layer stack with the polysilicon gate electrode 321 basically corresponds to the insulating material 360 that fills the trench 308. The gate electrode 321 is thus embedded in the insulating material formed by the gate dielectric 322 and the second insulating layer 323.

In a further process, an electrical connection from the surface or first side 301 to the gate electrode 321 is formed, for example by depositing a conductive material, such as highly doped polysilicon, into an hole or contact opening etched into the second insulating layer 323 down to the top of gate electrode 321, followed by an etching back process to recess the deposited conductive material to the side 301.

The electrical connection to the gate electrode 321 can also be formed in a laterally enlarged portion of the trench 308. For example, the trench 308 may include a portion that has a larger lateral width than the remaining portions of the trench 308. When conformally depositing the second insulating layer 323 into the enlarged portion, the portion is not completely filled. Using an anisotropic etching back process, spacers above the gate electrode at the sidewalls of the trench 308 are formed from the deposited material of the second insulating layer 323 while the deposited material is removed from the gate electrode between the spacers. A conductive material can then be deposited to form the electrical connection to the gate electrode 321.

The body contact structure 330b has basically the same structure as the respective semiconductor devices with the difference, that a doping well 318 which is of the same conductivity as the respective body region 312 is embedded in the source region 311. Furthermore, instead of a source contact region 314, which is of the same conductivity type as the source region 311, a well contact region 315 is formed which is of the same conductivity type as the body region 312. This modification provides an ohmic connection between the second metal layer 372 and the body regions 312 through the second silicide layer 352, the well contact region 315 and the doping well 318.

Figure 15C:
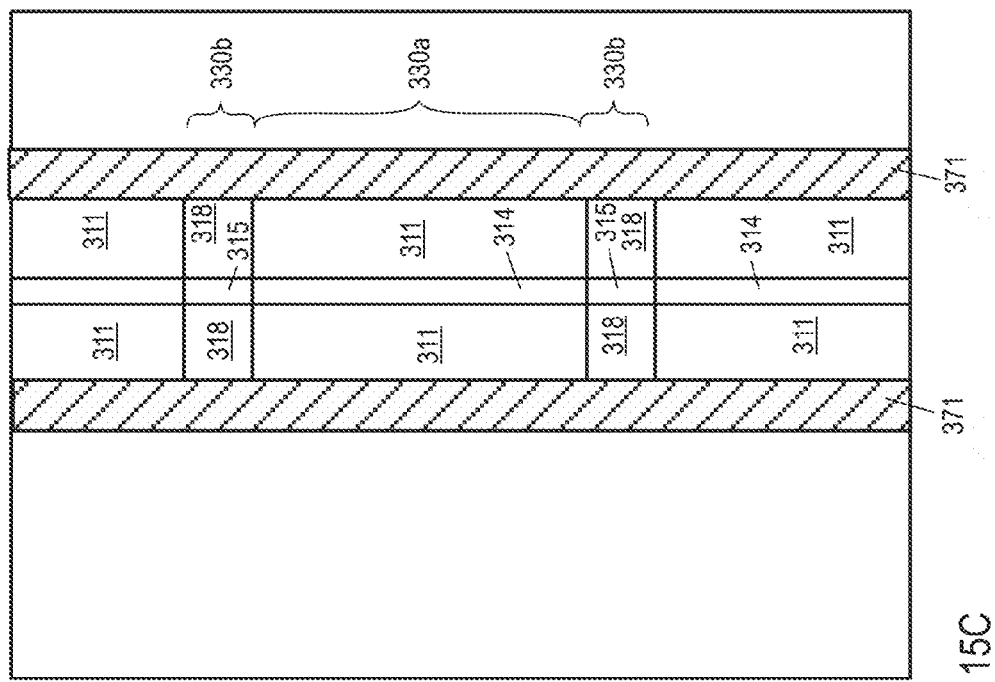
FIG. 15C illustrates a plan view onto a portion of the semiconductor device illustrated in FIGS. 15A and 15C.

FIG. 15C illustrates a plan view onto a section of the semiconductor device including the semiconductor element 330a and the body contact structure 330b. FIG. 15C only shows the doping regions relative to the first metal layer 371 which form the drain contacts. By additionally implanting the doping well 318 and reversing the conductivity type of the source contact regions 314 to form well contact regions 315 both the source region 311 and the body region 312, which is arranged below the first metal layer 371, can be electrically connected.

In view of the above, a method for manufacturing a semiconductor device includes providing a semiconductor substrate 100 having a first side 101. A trench 108 having a bottom 108a is formed. The trench 108 separates a first mesa region 107a from a second mesa region 107b formed in the semiconductor substrate 100. The trench 108 is filled with an insulating material 160, and the second mesa region 107b is removed relative to the insulating material 160 filled in the trench 108 to form a recess 109 in the semiconductor substrate 100. In a common process, a first silicide layer 151 is formed on and in contact with a top region 110 of the first mesa region 107a at the first side 101 of the semiconductor substrate 100 and a second silicide layer 152 is formed on and in contact with the bottom 109a of the recess 109.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
   providing a semiconductor substrate having a first side;
   forming a trench having a bottom, the trench extending from the first side of the semiconductor substrate into the semiconductor substrate and separating a first mesa region formed in the semiconductor substrate from a second mesa region formed in the semiconductor substrate;
   filling the trench with an insulating material;
   removing the second mesa region relative to the insulating material filled in the trench to form a recess in the semiconductor substrate, the recess having at least one side wall covered with the insulating material and a bottom; and
   forming, in a common process, a first silicide layer on and in contact with a top region of the first mesa region at the first side of the semiconductor substrate and a second silicide layer on and in contact with the bottom of the recess.

2. The method of claim 1, wherein a distance between the first side of the semiconductor substrate and the bottom of the recess is at least 500 nm.

3. The method of claim 1, further comprising:
   depositing a common metal layer on and in contact with the first silicide layer and on and in contact with the second silicide layer;
   forming a mask layer on the metal layer; and
   etching the common metal layer using the mask layer as an etching mask to form a first metal layer on and in contact with the first silicide layer and a second metal layer on and in contact with the second silicide layer.

4. The method of claim 1, further comprising:
   forming a first doping region in the first mesa region, wherein the first silicide layer is in ohmic contact with the first doping region; and
   forming a second doping region in the semiconductor substrate at the bottom of the recess, wherein the second silicide layer is in ohmic contact with the second doping region.

5. The method of claim 1, wherein the trench completely laterally surrounds the second mesa region when viewed in plane projection onto the first side of the semiconductor substrate.

6. The method of claim 1, wherein the second mesa region forms, when viewed in plane projection onto the first side of the semiconductor substrate, a closed ring structure, wherein the second mesa region is laterally bound by an inner trench and an outer trench.

7. The method of claim 1, further comprising:
   depositing a metal liner comprising at least a silicide-forming metal on the first side of the semiconductor substrate and in the recess;
   conducting a thermal treatment so that the silicide-forming metal of the metal liner reacts with exposed regions of the semiconductor substrate to form the first and second silicide layers; and
   removing unreacted silicide-forming metal from the insulating material.

* * * * *